(12) United States Patent
Kim et al.

(10) Patent No.: US 11,889,706 B2
(45) Date of Patent: Jan. 30, 2024

(54) DISPLAY DEVICE

(71) Applicant: SAMSUNG DISPLAY CO., LTD., Yongin-si (KR)

(72) Inventors: Kyung Hoon Kim, Yongin-si (KR); Won Kyu Kwak, Yongin-si (KR); Mi Hae Kim, Yongin-si (KR); Hyun Chol Bang, Yongin-si (KR); Ki Myeong Eom, Yongin-si (KR); Jae Sic Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 412 days.

(21) Appl. No.: 16/568,920

(22) Filed: Sep. 12, 2019

(65) Prior Publication Data
US 2020/0105849 A1 Apr. 2, 2020

(30) Foreign Application Priority Data
Sep. 28, 2018 (KR) .................. 10-2018-0116601

(51) Int. Cl.
| | |
|---|---|
| *H10K 59/121* | (2023.01) |
| *H10K 59/124* | (2023.01) |
| *H10K 59/126* | (2023.01) |
| *H10K 59/131* | (2023.01) |

(52) U.S. Cl.
CPC ....... *H10K 59/1213* (2023.02); *H10K 59/124* (2023.02); *H10K 59/126* (2023.02); *H10K 59/1216* (2023.02); *H10K 59/131* (2023.02)

(58) Field of Classification Search
CPC ... H01L 27/3248–3265; H01L 27/3272–3276; H10K 59/1213
See application file for complete search history.

(56) References Cited

U.S. PATENT DOCUMENTS

| | | |
|---|---|---|
| 9,183,776 B2 | 11/2015 | Song |
| 9,412,327 B2 | 8/2016 | Kim et al. |
| 9,837,024 B2 | 12/2017 | Wang et al. |
| 10,074,316 B2 | 9/2018 | Fu et al. |

(Continued)

FOREIGN PATENT DOCUMENTS

| | | |
|---|---|---|
| KR | 1020140061140 A | 5/2014 |
| KR | 1020150004661 A | 1/2015 |

(Continued)

*Primary Examiner* — Eric K Ashbahian
(74) *Attorney, Agent, or Firm* — CANTOR COLBURN LLP

(57) ABSTRACT

A display device includes a substrate, pixels each including at least one transistor, a storage capacitor connected to the at least one transistor, and a light emitting element connected to the at least one transistor, scan lines connected to each of the pixels, a data line connected to each of the pixels, and a power line supplying a first power voltage to the light emitting element. The power line includes a first conductive pattern that extends in a first direction, and is provided on a first insulating interlayer, a second conductive pattern that extends in the first direction, is provided on a second insulating interlayer, and is connected to the first conductive pattern through a first contact hole, and a third conductive pattern that extends in a second direction, is provided on a third insulating interlayer, and is connected to the second conductive pattern through a second contact hole.

25 Claims, 18 Drawing Sheets

(56) References Cited

U.S. PATENT DOCUMENTS

| | | | |
|---|---|---|---|
| 10,192,935 B2 | 1/2019 | Shim et al. | |
| 10,446,636 B2 | 10/2019 | Lee et al. | |
| 2011/0227098 A1* | 9/2011 | Choi | H01L 27/3276 |
| | | | 257/88 |
| 2015/0009441 A1* | 1/2015 | Jiang | G02F 1/136286 |
| | | | 438/158 |
| 2016/0233253 A1* | 8/2016 | Kim | H01L 27/1255 |
| 2017/0077205 A1* | 3/2017 | Kim | H01L 27/3276 |
| 2017/0221979 A1* | 8/2017 | Chae | H10K 59/131 |
| 2018/0005576 A1 | 1/2018 | Yoon et al. | |
| 2018/0006263 A1 | 1/2018 | Yoon et al. | |
| 2018/0061908 A1* | 3/2018 | Shim | G09G 3/32 |
| 2018/0151658 A1* | 5/2018 | Jeong | H01L 27/3265 |
| 2019/0103456 A1* | 4/2019 | Choi | H01L 27/3276 |
| 2019/0198801 A1* | 6/2019 | Kuon | H01L 51/5253 |

FOREIGN PATENT DOCUMENTS

| | | |
|---|---|---|
| KR | 1020150135574 A | 12/2015 |
| KR | 1020160094579 A | 8/2016 |
| KR | 1020180025520 A | 3/2018 |
| KR | 1020180042504 A | 4/2018 |

\* cited by examiner

DISPLAY DEVICE

The application claims priority to Korean patent application 10-2018-0116601 filed on Sep. 28, 2018, and all the benefits accruing therefrom under 35 U.S.C. § 119, the content of which in its entirety is herein incorporated by reference.

BACKGROUND

1. Field

Exemplary embodiments of the invention generally relate to a display device, and more particularly, to an organic light emitting display device.

2. Description of the Related Art

Among display devices, an organic light emitting display device generally includes two electrodes and an organic emitting layer located between the two electrodes. In the organic light emitting display device, electrons injected from one of the two electrodes and holes injected from the other of the two electrodes are combined in the organic emitting layer so as to form excitons, and the excitons emit light through energy emission.

When a size, a resolution, and a desired driving frequency of a display device increase, a resistive-captive ("RC") delay increases. When the size and the desired luminance of the display device increase, a voltage ("IR") drop increases. Recently, studies on a display panel structure for preventing the RC delay and the IR drop have been conducted.

SUMMARY

Exemplary embodiments provide a display device having improved line resistance of a power line.

Exemplary embodiments also provide a display device having improved resistive-capacitive ("RC") delay of a scan signal.

In an exemplary embodiment of the invention, there is provided a display device including a substrate including a display region and a non-display region, a plurality of pixels in the display region, the plurality of pixels each including at least one transistor, a storage capacitor connected to the at least one transistor, and a light emitting element connected to the at least one transistor, a plurality of scan lines connected to each of the pixels, the plurality of scan lines extending in a first direction, a data line connected to each of the pixels, the data line extending in a second direction, and a power line supplying a first power voltage to the light emitting element, wherein the at least one transistor includes an active pattern provided on the substrate, source and drain electrodes each connected to the active pattern, a gate electrode provided on the active pattern with a gate insulating layer interposed therebetween to overlap the active pattern, an insulating interlayer including a first insulating interlayer, a second insulating interlayer, and a third insulating interlayer, which cover the gate electrode and are sequentially stacked, and a protective layer provided on the insulating interlayer, where the power line includes a first conductive pattern extending in the first direction, the first conductive pattern being provided on the first insulating interlayer, a second conductive pattern extending in the first direction, the second conductive pattern being provided on the second insulating interlayer, the second conductive pattern being connected to the first conductive pattern through a first contact hole, and a third conductive pattern extending in the second direction, the third conductive pattern being provided on the third insulating interlayer, the third conductive pattern being connected to the second conductive pattern through a second contact hole.

In an exemplary embodiment, the storage capacitor may include a lower electrode disposed in the same layer as the gate electrode, and an upper electrode overlapping the lower electrode, the upper electrode being disposed on the first insulating interlayer.

In an exemplary embodiment, the first conductive pattern and the second conductive pattern may overlap at least a portion of the lower electrode of the storage capacitor.

In an exemplary embodiment, an area of the first conductive pattern overlapping the lower electrode may be larger than an area of the second conductive pattern overlapping the lower electrode.

In an exemplary embodiment, on a plane view, an opening may not be defined in the upper electrode.

In an exemplary embodiment, the power line may have a mesh structure by connection of the first to third conductive patterns.

In an exemplary embodiment, at least one of the scan lines may be disposed in the same layer as the second conductive pattern, and be connected to the gate electrode.

In an exemplary embodiment, the gate electrode may be a conductive pattern having an island shape.

In an exemplary embodiment, at least one of the scan lines may include aluminum alloy.

In an exemplary embodiment, the display device may further include an emission control line connected to each of the pixels, the emission control line extending in the first direction.

In an exemplary embodiment, the emission control line may be disposed in the same layer as the gate electrode.

In an exemplary embodiment, the emission control line may be disposed in the same layer as the second conductive pattern.

In an exemplary embodiment, the display device may further include an initialization line supplying an initialization voltage to the pixels. The initialization line may include a first initialization conductive pattern disposed in the same layer as the second conductive pattern, the first initialization conductive pattern extending in the first direction.

In an exemplary embodiment, the initialization line may further include a second initialization conductive pattern disposed in the same layer as the third conductive pattern, the second initialization conductive pattern extending in the second direction.

In an exemplary embodiment, the display device may further include a shielding pattern disposed in the same layer as the first conductive pattern, the shielding pattern being connected to the second initialization conductive pattern.

In an exemplary embodiment, the at least one transistor may include a driving transistor controlling a driving current flowing through the light emitting element. In a plan view, the shielding pattern may include a portion located between the data line and a gate node of the driving transistor.

In another exemplary embodiment of the invention, there is provided a display device including a substrate including a display region and a non-display region, a plurality of pixels in the display region, the plurality of pixels each including at least one transistor, a storage capacitor connected to the at least one transistor, and a light emitting element connected to the at least one transistor, a plurality of scan lines connected to each of the pixels, the plurality of scan lines extending in a first direction, a data line connected to each of the pixels, the data line extending in a second direction, and a power line supplying a first power voltage to the light emitting element, where the at least one transistor includes an active pattern provided on the substrate, source and drain electrodes each connected to the active pattern, a gate electrode provided on the active pattern with a gate insulating layer interposed therebetween to overlap the active pattern, an insulating interlayer including a first insulating interlayer, a second insulating interlayer, and a third insulating interlayer, which cover the gate electrode and are sequentially stacked, and a protective layer provided on the insulating interlayer, where at least one of the scan lines is disposed on the second insulating interlayer, and is connected to the gate electrode through a contact hole.

In an exemplary embodiment, the gate electrode connected to the at least one of the scan lines may be a conductive pattern having an island shape.

In an exemplary embodiment, the power line may include a first conductive pattern extending in the first direction, the first conductive pattern being provided on the first insulating interlayer, a second conductive pattern extending in the first direction, the second conductive pattern being provided on the second insulating interlayer, the second conductive pattern being connected to the first conductive pattern, and a third conductive pattern extending in the second direction, the third conductive pattern being provided on the third insulating interlayer, the third conductive pattern being connected to the second conductive pattern.

In an exemplary embodiment, an area of the first conductive pattern may be larger than an area of the second conductive pattern.

Resistances of the second conductive pattern and the third conductive pattern may be smaller than a resistance of the first conductive pattern.

In an exemplary embodiment, the display device may further include an emission control line connected to each of the pixels, the emission control line extending in the first direction.

In an exemplary embodiment, the emission control line may be disposed in the same layer as the gate electrode.

In an exemplary embodiment, the storage capacitor may include a lower electrode disposed in the same layer as the gate electrode, and an upper electrode overlapping the lower electrode, the upper electrode being disposed on the first insulating interlayer. In a plan view, an opening is not defined in the upper electrode.

In an exemplary embodiment, the display device may further include an initialization line supplying an initialization voltage to the pixels. The initialization line may include a first initialization conductive pattern disposed on the second insulating interlayer, the first initialization conductive pattern extending in the first direction, and a second initialization conductive pattern disposed on the third insulating interlayer, the second initialization conductive pattern extending in the second direction.

BRIEF DESCRIPTION OF THE DRAWINGS

Exemplary embodiments will now be described more fully hereinafter with reference to the accompanying drawings.

DETAILED DESCRIPTION

Figure 1:
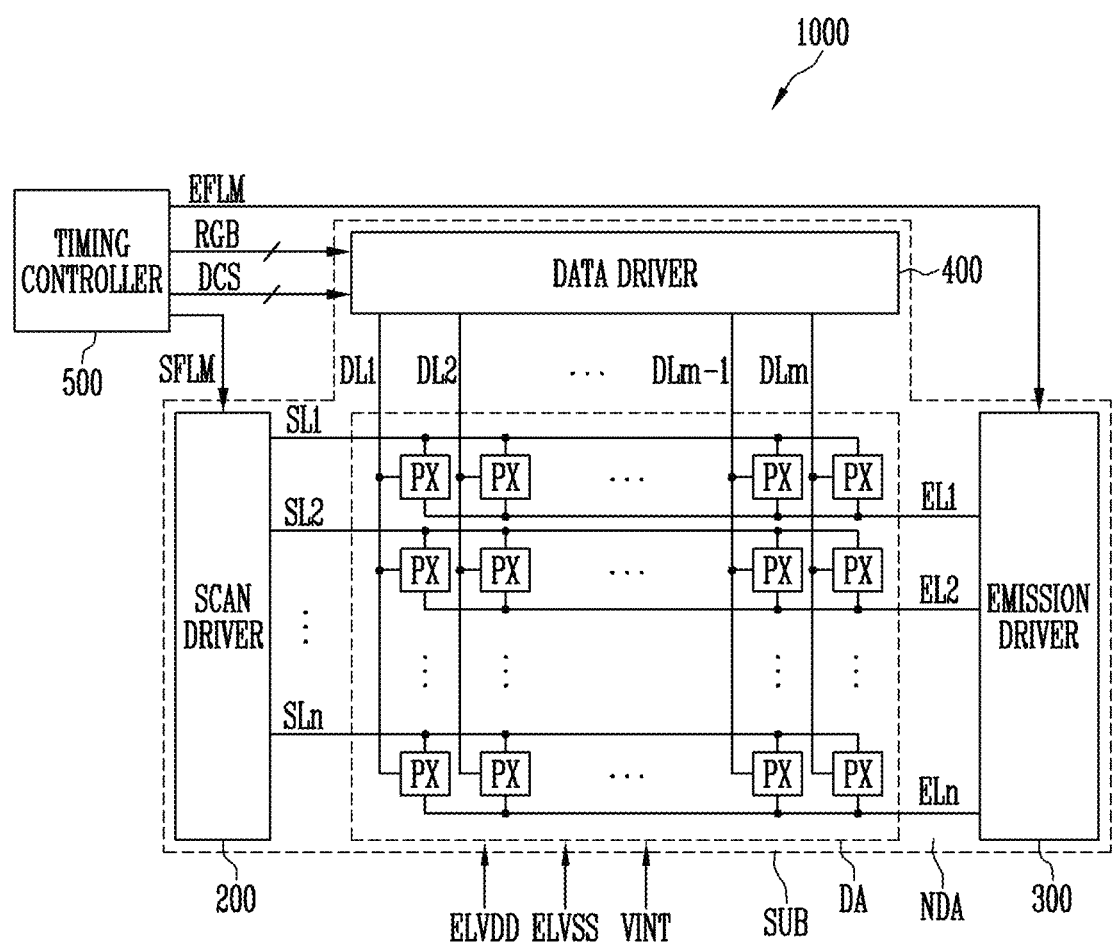
FIG. 1 is a block diagram illustrating an exemplary embodiment of a display device according to the invention.

Hereinafter, exemplary embodiments of the invention will be described in more detail with reference to the accompanying drawings. Throughout the drawings, the same reference numerals are given to the same elements, and their overlapping descriptions will be omitted.

In the drawing figures, dimensions may be exaggerated for clarity of illustration. It will be understood that when an element is referred to as being "between" two elements, it may be the only element between the two elements, or one or more intervening elements may also be present. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

FIG. 1 is a block diagram illustrating an exemplary embodiment of a display device according to the invention.

Referring to FIG. 1, the display device 1000 may include a substrate SUB, a plurality of pixels PX, a driving unit for driving the pixels PX, and scan lines SL1 to SLn where n is a natural number, emission control lines EL1 to ELn, data lines DL1 to DLm where m is a natural number, and power lines (not shown), which connect the pixels PX and the driving unit.

The substrate SUB may have various shapes. In an exemplary embodiment, the substrate SUB may have a closed polygonal shape including linear sides, for example. In an exemplary embodiment, the substrate SUB may have a shape such as a circle or ellipse, which includes a curved side. In an exemplary embodiment, the substrate SUB may have a shape such as a semicircle or semi-ellipse, which includes linear and curved sides. The substrate SUB may include a display region DA including the pixels PX and a non-display region NDA at the periphery of the display region DA.

The pixels PX may be arranged in the display region DA of the substrate SUB. Each of the pixels PX may include at least one transistor, a storage capacitor, and a light emitting element. In an exemplary embodiment, the light emitting element may be an organic light emitting diode ("OLED"), for example. However, this is merely illustrative, and the light emitting element is not limited thereto.

The driving unit may include a scan driver 200, an emission driver 300, a data driver 400, and a timing controller 500. Although a case where the scan driver 200, the emission driver 300, and the data driver 400 are disposed on the substrate SUB is illustrated in FIG. 1, the position of the driving unit is not limited thereto.

The scan lines SL1 to SLn, the data lines DL1 to DLm, and the power lines may be connected to the pixels PX. The scan lines SL1 to SLn may provide a scan signal to the pixels PX, and the data lines DL1 to DLm may provide a data signal to the pixels PX.

The pixels PX may be supplied with a first power voltage ELVDD, a second power voltage ELVSS, and an initialization power voltage VINT from an external power source (power supply), etc. The first power voltage ELVDD may be applied to the pixels PX through a power line PL (refer to FIG. 2), and the initialization power voltage VINT may be applied to the pixels PX through an initialization line VIL (refer to FIG. 2).

The scan driver 200 may supply a scan signal to the scan lines SL1 to SLn in response to a scan start signal SFLM received from the timing controller 500.

The emission driver 300 may supply an emission control signal to the emission control lines EL1 to ELn in response to an emission control start signal EFLM received from the timing controller 500.

The data driver 400 may supply an analog data signal RGB to the data lines DL1 to DLm in response to a data control signal DCS received from the timing controller 500.

The timing controller 500 may supply the scan start signal SFLM to the scan driver 200, supply the emission control start signal EFLM to the emission driver 300, and supply the data control signal DCS and the data signal RGB to the data driver 400, based on timing signals supplied from the outside.

Figure 2:
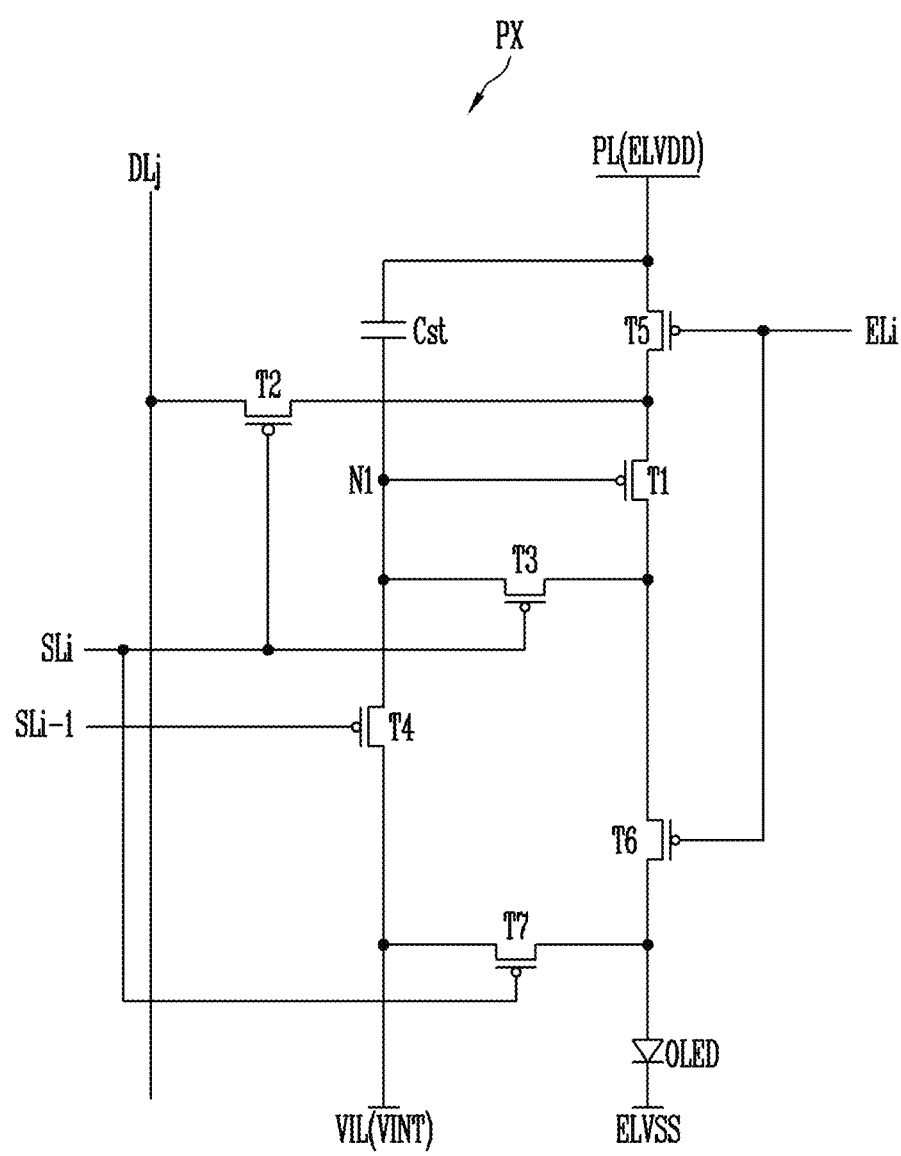
FIG. 2 is a circuit diagram illustrating an example of a pixel included in the display device of FIG. 1.

FIG. 2 is a circuit diagram illustrating an example of the pixel included in the display device of FIG. 1.

The pixel PX of FIG. 2 is a pixel connected to a jth data line DLj and an ith scan line SLi (j and i are natural numbers), for example.

Referring to FIGS. 1 and 2, the pixel PX may include an organic light emitting diode OLED, first to seventh transistors T1 to T7, and a storage capacitor Cst.

An anode electrode of the organic light emitting diode OLED may be connected to the first transistor T1 via the sixth transistor T6, and a cathode electrode of the organic light emitting diode OLED may receive the second power voltage ELVSS. The organic light emitting diode OLED may generate light with a predetermined luminance corresponding to an amount of current supplied from the first transistor T1.

The first power voltage ELVDD supplied to the first transistor T1 may be set as a voltage higher than the second power voltage ELVSS such that the current may flow through the organic light emitting diode OLED.

The seventh transistor T7 may be connected between the initialization power voltage VINT and the anode electrode of the organic light emitting diode OLED. In an exemplary embodiment, a gate electrode of the seventh transistor T7 may be connected to the ith scan line SLi. The seventh transistor T7 may be turned on when a scan signal is supplied to the ith scan line SLi, to supply the initialization power voltage VINT to the anode electrode of the organic light emitting diode OLED. That is, the seventh transistor T7 may be a transistor for initializing an anode voltage of the organic light emitting diode OLED.

The initialization power voltage VINT may be set as a voltage lower than a data voltage. However, the scan line connected to the gate electrode of the seventh transistor T7 is merely illustrative, and the invention is not limited thereto. In an exemplary embodiment, one of an (i−2)th scan line SLi−2, an (i−1)th scan line SLi−1, and an (i+1)th scan line SLi+1 may be connected to the gate electrode of the seventh transistor T7, for example.

The sixth transistor T6 may be connected between the first transistor T1 and the organic light emitting diode OLED. A gate electrode of the sixth transistor T6 may be connected to an ith emission control line ELi.

The fifth transistor T5 may be connected between the first power voltage ELVDD and the first transistor T1. A gate electrode of the fifth transistor T5 may be connected to the ith emission control line ELi.

A first electrode of the first transistor (also referred to as driving transistor) T1 may receive the first power voltage ELVDD via the fifth transistor T5, and a second electrode of the first transistor T1 may be connected to the anode electrode of the organic light emitting diode OLED via the sixth transistor T6. A gate electrode of the first transistor T1 may be connected to a first node N1. The first transistor T1 may control an amount of current flowing through the organic light emitting diode OLED.

The third transistor T3 may be connected between the second electrode of the first transistor T1 and the first node N1. A gate electrode of the third transistor T3 may be connected to the ith scan line SLi. The third transistor T3 may be turned on when a scan signal is supplied to the ith scan line SLi, to electrically connect the second electrode of the first transistor T1 and the first node N1. Therefore, when the third transistor T3 is turned on, the first transistor T1 may be diode-connected, and a threshold voltage of the first transistor T1 may be compensated. That is, the third transistor T3 may be a transistor for compensating for the threshold voltage of the first transistor T1.

The fourth transistor T4 may be connected between the first node N1 and the initialization power voltage VINT. A gate electrode of the fourth transistor T4 may be connected to the (i−1)th scan line SLi−1. The fourth transistor T4 may be turned on when a scan signal is supplied to the (i−1)th scan line SLi−1, to supply the initialization power voltage VINT to the first node N1. That is, the fourth transistor T4 may be a transistor for initializing a gate voltage of the first transistor T1.

The second transistor T2 may be connected between the jth data line DLj and the first electrode of the first transistor T1. A gate electrode of the second transistor T2 may be connected to the ith scan line SLi. The second transistor T2 may be turned on when a scan signal is supplied to the ith scan line SLi, to electrically connect the jth data line DLj and the first electrode of the first transistor T1.

The storage capacitor Cst may be connected between the first power voltage ELVDD and the first node N1. The storage capacitor Cst may store a voltage corresponding to the data signal and the threshold voltage of the first transistor T1.

Figure 3:
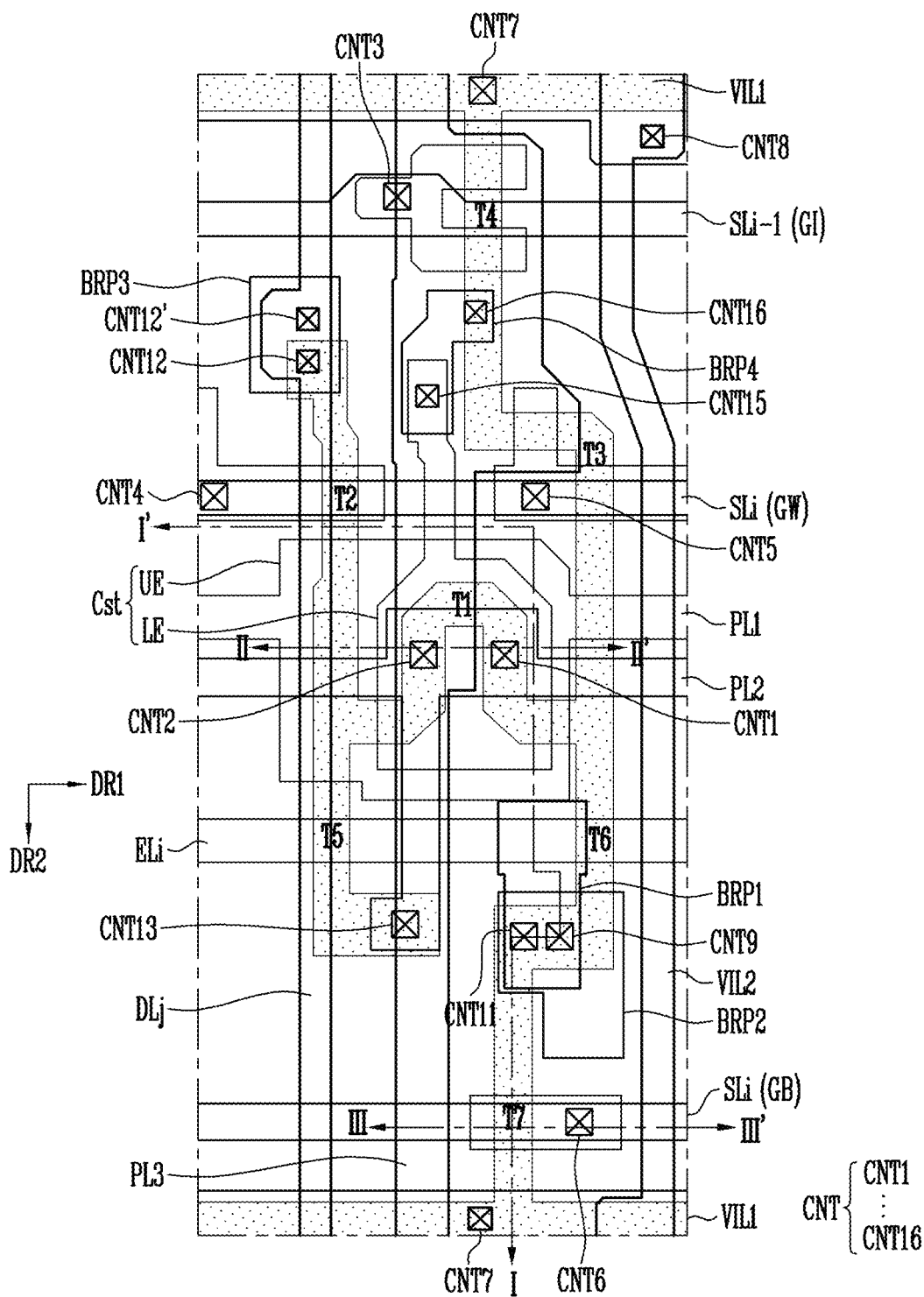
FIG. 3 is a plan view illustrating an example of the pixel of FIG. 2.
Figure 4:
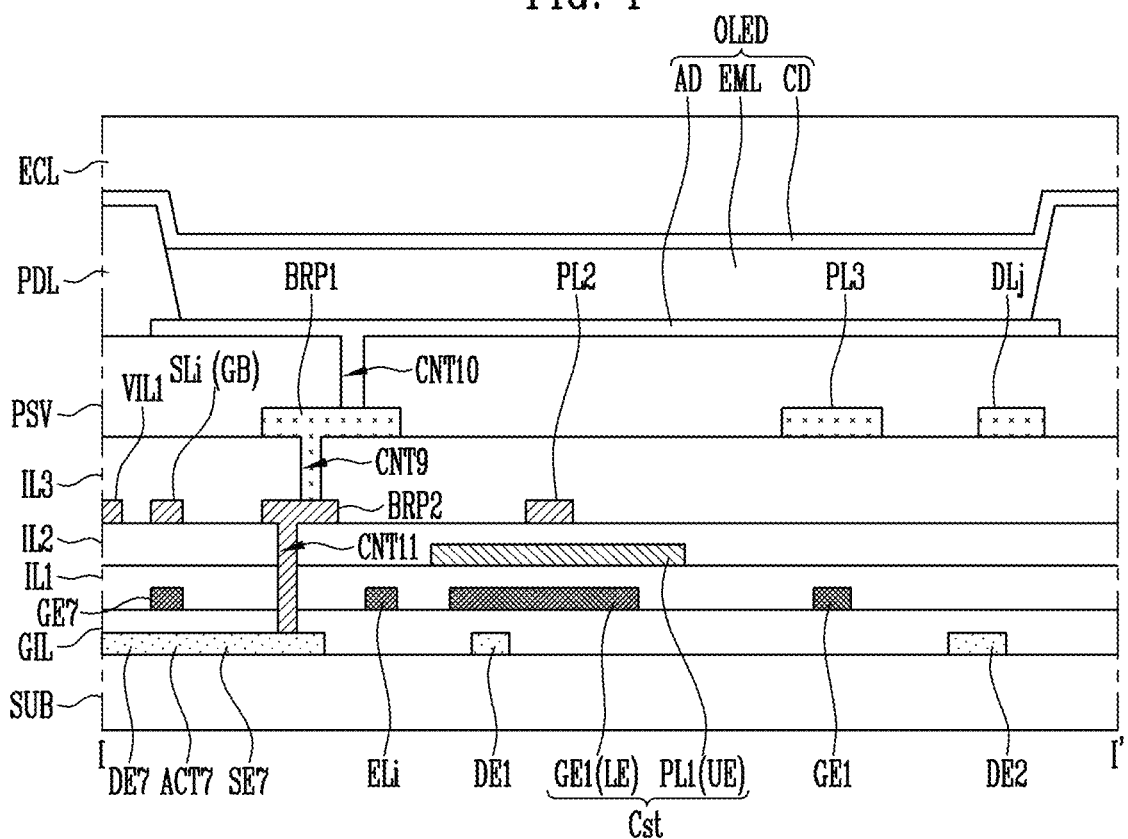
FIG. 4 is a cross-sectional view taken along line I-I' of the pixel of FIG. 3.
Figure 5:
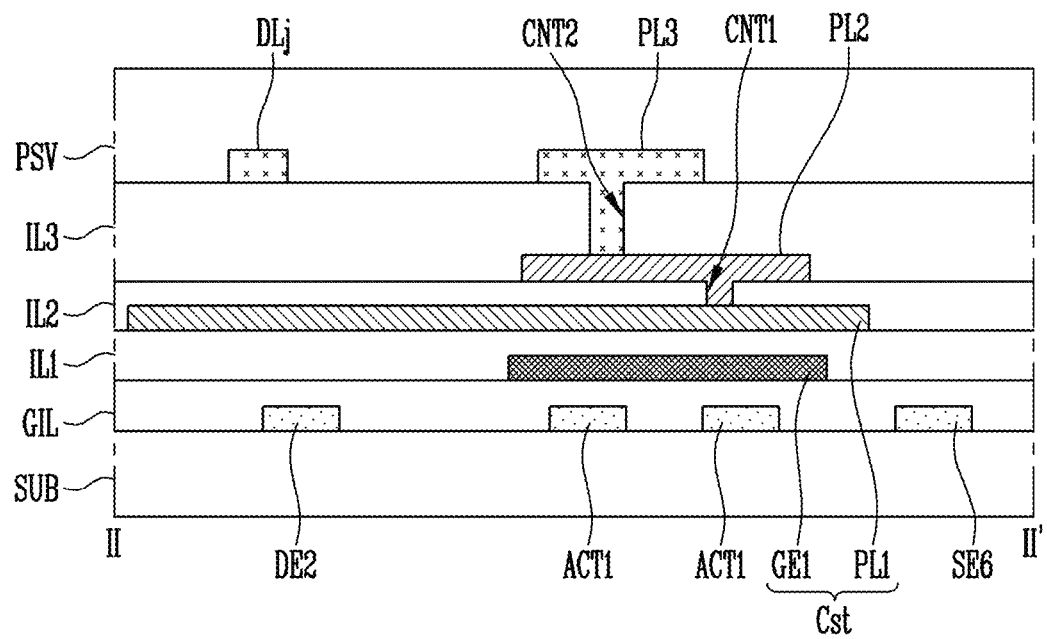
FIG. 5 is a cross-sectional view taken along line II-IF of the pixel of FIG. 3.
Figure 6:
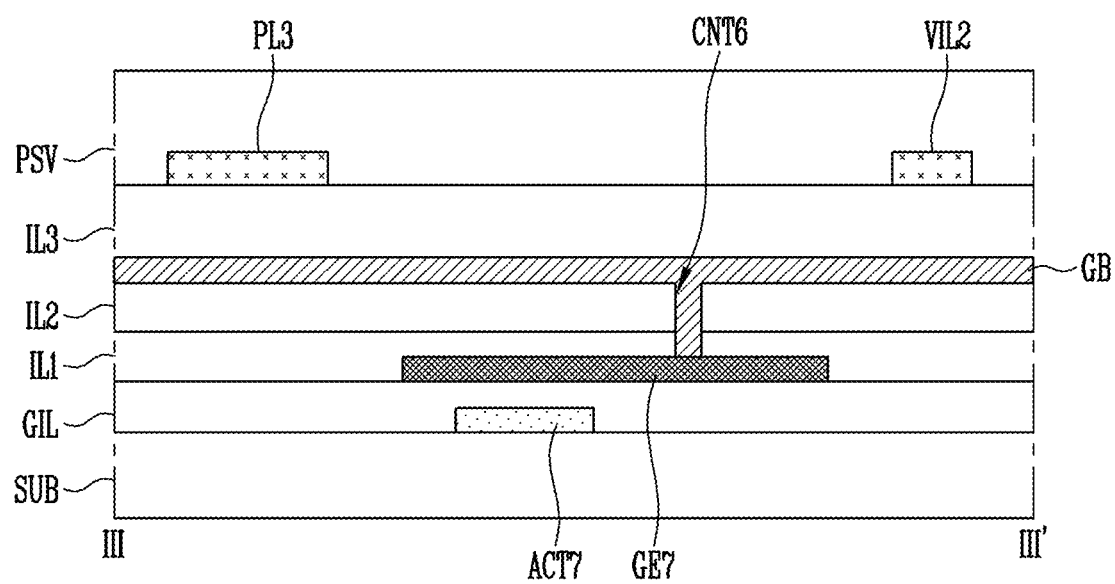
FIG. 6 is a cross-sectional view taken along line of the pixel of FIG. 3.

FIG. 3 is a plan view illustrating an example of the pixel of FIG. 2. FIG. 4 is a cross-sectional view taken along line I-I' of the pixel of FIG. 3. FIG. 5 is a cross-sectional view taken along line II-II' of the pixel of FIG. 3. FIG. 6 is a cross-sectional view taken along line of the pixel of FIG. 3.

Hereinafter, a scan line SLi connected to second and third transistor T2 and T3 may be construed as a gate write line GW, a scan line SLi−1 connected to a fourth transistor T4 may be construed as an initialization control line GI, and a scan line SLi connected to a seventh transistor T7 may be construed as an anode initialization control line GB.

Referring to FIGS. 1 to 6, the display device 1000 may include a substrate SUB, a plurality of conductive lines, and a pixel PX connected to the conductive lines.

For convenience of description, an organic light emitting diode is omitted in FIGS. 3, 5, and 6, and a stacking structure of the organic light emitting diode OLED is exemplarily illustrated in FIG. 4.

The pixel PX may include a pixel circuit provided with first to seventh transistors T1 to T7 and a storage capacitor Cst, and an organic light emitting diode connected to the pixel circuit. The pixel circuit may be electrically connected to scan lines SLi and SLi−1, a data line DLj, a power line PL, and an initialization line VIL.

The substrate SUB may be provided as a backplane substrate or base substrate. The substrate SUB may include a transparent insulating material to enable light to be transmitted therethrough. In an exemplary embodiment, the substrate SUB may be a flexible substrate, for example. In an exemplary embodiment, the substrate SUB may be one of a film substrate and a plastic substrate, which include a polymer organic material. In an exemplary embodiment, the substrate SUB may include polyimide, for example.

In an exemplary embodiment, a buffer layer and/or a barrier layer may be disposed on the substrate SUB. The buffer layer and/or the barrier layer may prevent diffusion of impurities, moisture, etc., generated from the substrate SUB, and function to adjust the propagation speed of heat in a crystallization process for forming a semiconductor pattern. In an exemplary embodiment, the buffer layer and/or the barrier layer may include silicon oxide (SiOx), silicon nitride (SiNx), silicon oxynitride (SiOxNy), etc., for example. The buffer layer and/or the barrier layer may have a single- or multi-layered structure including a silicon combination.

The first to seventh transistors T1 to T7 may be disposed on the substrate SUB. Each of the first to seventh transistors T1 to T7 may include an active pattern provided on the substrate SUB, a source and drain electrodes each connected to the active pattern, a gate electrode provided on the active pattern with a gate insulating layer GIL interposed therebetween to overlap the active pattern, an insulating interlayer including a first insulating interlayer IL', a second insulating interlayer IL2, and a third insulating interlayer IL3, which cover the gate electrode and are sequentially stacked, and a protective layer PSV provided on the insulating interlayer.

The power line PL may include a first conductive pattern PL1, a second conductive pattern PL2, and a third conductive pattern PL3. For convenience of description, the first conductive pattern PL1, the second conductive pattern PL2, and the third conductive pattern PL3 may be construed as a first power line PL1, a second power line PL2, and a third power line PL3, respectively.

The first conductive pattern PL1 may extend in a first direction DR1, and be disposed on the first insulating interlayer IL1. The second conductive pattern PL2 may extend in the first direction DR1, and be disposed on the second insulating interlayer IL2. The first conductive pattern PL1 and the second conductive pattern PL2 may be connected to each other through a first contact hole CNT1. In an exemplary embodiment, the first conductive pattern PL1 and the second conductive pattern PL2 may overlap at least a portion of a lower electrode LE of the storage capacitor Cst. In addition, an area of the first conductive pattern PL1 overlapping the lower electrode LE may be larger than that of the second conductive pattern PL2 overlapping the lower electrode LE.

In an exemplary embodiment, the first conductive pattern PL1 may include molybdenum (Mo) or an alloy thereof, for example. However, this is merely illustrative, and the material included in the first conductive pattern PL1 is not limited thereto. In an exemplary embodiment, the first conductive pattern PL1 may include metal, alloy, metal nitride, conductive metal oxide, a transparent conductive material, etc., for example.

In an exemplary embodiment, the second conductive pattern PL2 may include a low-resistance material. The second conductive pattern PL2 may have a resistance lower than that of the first conductive pattern PL1. In an exemplary embodiment, the second conductive pattern PL2 may have an aluminum alloy structure in which titanium (Ti), aluminum ("AL"), and titanium (Ti) are sequentially stacked, for example. However, this is merely illustrative, and the material of the second conductive pattern PL2 is not limited thereto. In an exemplary embodiment, the second conductive pattern PL2 may include gold (Au), silver (Ag), Al, platinum (Pt), nickel (Ni), titanium (Ti), palladium (Pd), magnesium (Mg), calcium (Ca), lithium (Li), chromium (Cr), tantalum (Ta), molybdenum (Mo), scandium (Sc), neodymium (Nd), iridium (Ir), aluminum alloy, aluminum nitride (AlNx), silver alloy, tungsten (W), tungsten nitride (WNx), copper alloy, molybdenum alloy, titanium nitride (TiNx), tantalum nitride (TaNx), strontium ruthenium oxide (SrRuxOy), zinc oxide (ZnOx), indium tin oxide ("ITO"), tin oxide (SnOx), indium oxide (InOx), gallium oxide (GaOx), indium zinc oxide ("IZO"), etc., for example. These may be used alone or in a combination thereof.

In an exemplary embodiment, the first and second conductive patterns PL1 and PL2 may overlap the first transistor T1.

The third conductive pattern PL3 may extend in a second direction DR2, and be disposed on the third insulating interlayer IL3. The third conductive pattern PL3 may be connected to the second conductive pattern PL2 through a second contact hole CNT2. The third conductive pattern PL3 may include a low-resistance metal. In an exemplary embodiment, the third conductive pattern PL3 may have an aluminum alloy structure in which titanium (Ti), AL, and titanium (Ti) are sequentially stacked, for example. In an exemplary embodiment, the third conductive pattern PL3 may have the same material as that of the second conductive pattern PL2, for example.

The first and second conductive patterns PL1 and PL2 may extend in the horizontal direction (e.g., the first direction DR1), and the third conductive pattern PL3 may extend in the vertical direction (e.g., the second direction DR2). The power line PL may have a mesh structure provided with three conductive layers by connection of first to third conductive patterns PL1 to PL3.

The first to third conductive patterns PL1, PL2, and PL3 may be electrically connected to each other by the first and second contact holes CNT1 and CNT2. That is, the first to third conductive patterns PL1, PL2, and PL3 may transfer the same first power voltage ELVDD. In addition, the power line PL may have a double wiring structure including the first and second conductive patterns PL1 and PL2 that extend to partially overlap each other in the horizontal direction. A voltage drop (i.e., an IR drop) of the first power voltage ELVDD in the first direction DR1 may be reduced by the double wiring structure and the second conductive pattern PL2 including the low-resistance metal. Thus, the luminance uniformity of the display device 1000 may be improved.

The scan lines SLi and SLi−1 may extend in the first direction DR1. In an exemplary embodiment, the scan lines SLi and SLi−1 may be arranged along the second direction DR2 in a sequence of a gate initialization control line GI, a gate write line GW, and an anode initialization control line GB, for example. Hereinafter, the gate initialization control line GI, the gate write line GW, and the anode initialization control line GB will be described as a first scan line GI, a second scan line GW, and a third scan line GB, respectively.

At least one of the scan lines GI, GW, and GB may be disposed in the same layer as the second conductive patter PL2. The scan lines GI, GW, and GB may be connected to gate electrodes corresponding transistors through contact holes, respectively.

In an exemplary embodiment, as shown in FIGS. 3 and 4, the first to third scan lines GI, GW, and GB may be disposed in the same layer as the second conductive pattern PL2. Accordingly, the first to third scan lines GI, GW, and GB may include the same material as that of the second conductive pattern PL2. In an exemplary embodiment, the first to third scan lines GI, GW, and GB may include a low-resistance metallic material such as an aluminum alloy, for example. Thus, the resistance of the first to third scan lines GI, GW, and GB decreases, so that the resistive-capacitive ("RC") delay of a scan signal may be reduced. Further, the scan lines GI, GW, and GB are provided through a bridge structure between the gate electrode and the conductive patterns of the second insulating interlayer IL2, so that the influence from peripheral interference and static electricity may be reduced.

The first scan line GI may be connected to the gate electrode of the fourth transistor T4 through a third contact hole CNT3. The second scan line GW may be connected to the gate electrode of the second transistor T2 and the gate electrode of the third transistor T3 respectively through a fourth contact hole CNT4 and a fifth contact hole CNT5. In an exemplary embodiment, the second scan line GW may be connected to a gate electrode of a third transistor T3 of a pixel on a (j−1)th column and a gate electrode of a second transistor T2 of a pixel on a jth column through the fourth contact hole CNT4, and be connected to a gate electrode of a third transistor T3 of the pixel on the jth column and a gate electrode of a second transistor T2 of a pixel on a (j+1)th column through the fifth contact hole CNT5.

The third scan line GB may be connected to the gate electrode of the seventh transistor T7 through a sixth contact hole CNT6.

An emission control line ELi may be disposed in the same layer as the gate electrodes. However, this is merely illustrative, and the emission control line ELi may be disposed in the same layer as the second conductive pattern PL2. Therefore, the emission control line ELi may be connected to the gate electrode of the fifth transistor T5 and the gate electrode of the sixth transistor T6 through contact holes. When the emission control line ELi is disposed in the same layer as the low-resistance second conductive pattern PL2, the RC delay of an emission control signal due to the resistance of the emission control line ELi may be reduced.

The initialization line VIL (refer to FIG. 2) may supply an initialization power voltage VINT to the pixels PX. The initialization line VIL may include a first initialization conductive pattern VIL1 extending in the first direction DR1 and a second initialization conductive pattern VIL2 extending in the second direction DR2. That is, the initialization line VIL may have a mesh structure in which the first initialization conductive pattern VIL1 and the second initialization conductive pattern VIL2 intersect each other. For convenience of description, the first and second initialization conductive patterns VIL1 and VIL2 may be construed as first and second initialization lines VIL1 and VIL2, respectively.

The first initialization conductive pattern VIL1 may be disposed in the same layer as the second conductive pattern PL2 and extend in the first direction DR1. In an exemplary embodiment, the first initialization conductive pattern VIL1 may be connected to the drain electrode (or source electrode) of the fourth transistor T4 and the drain electrode (or source electrode) of the seventh transistor T7 through a seventh contact hole CNT7. In an exemplary embodiment, as shown in FIG. 3, a first initialization conductive pattern VIL1 at a lower end of an ith pixel may be simultaneously connected to a seventh transistor T7 of the ith pixel and a fourth transistor T4 of an (i+1)th pixel through the seventh contact hole CNT7.

The second initialization conductive pattern VIL2 may be disposed in the same layer as the third conductive pattern PL3. The second initialization conductive pattern VIL2 may be connected to the first initialization conductive pattern VIL1 through an eighth contact hole CNT8.

When the initialization conductive patterns VIL1 and VIL2 are disposed as described above, the non-uniformity of parasitic capacitance, which is caused by connection between the existing initialization conductive patterns, may be minimized.

Each of the first to seventh transistors T1 to T7 may include a gate electrode provided by an active pattern, a source electrode, and a drain electrode, which are provided by patterning a semiconductor layer, and a gate electrode layer. In an exemplary embodiment, the active pattern, the source electrode, and the drain electrode may include a semiconductor layer undoped with an impurity or doped with the impurity. In an exemplary embodiment, the source electrode and the drain electrode may include a semiconductor layer doped with the impurity, and the active pattern may include a semiconductor layer undoped with the impurity, for example. The drain electrode and the source electrode may be arbitrarily defined according to a voltage applied to each of the first to seventh transistors T1 to T7.

The storage capacitor Cst may include the lower electrode LE disposed in the same layer as the gate electrodes and an upper electrode UE disposed on the first insulating interlayer IL1 while overlapping the lower electrode LE. The lower electrode LE may be provided as the gate electrode of the first transistor T1. The upper electrode UE may be provided as the first conductive pattern PL1.

An opening is not defined in the upper electrode UE overlapping the lower electrode LE. That is, the first conductive pattern PL1 constituting the upper electrode UE is not connected to other components (e.g., transistors) except a component forming the power line PL, and hence the upper and lower electrodes UE and LE are not short-circuited with the other components. Thus, in the storage capacitor Cst according to the exemplary embodiment of the invention, an opening existing in the existing storage capacitor is removed, so that a capacitance variation caused by the formation of the opening is eliminated, and the capacitance (i.e., the area of an electrode) may be increased. Accordingly, a display spot and image crosstalk due to a capacitance variation of the storage capacitor Cst may be minimized.

Hereinafter, a structure of the display device according to the exemplary embodiment of the invention will be described along a stacking order with reference to FIGS. 4 to 6.

An active pattern ACT1 to ACT7 (hereinafter, referred to as ACT) may be disposed on the substrate SUB. The active pattern ACT (refer to FIG. 7) may include first to seventh active patterns ACT1 to ACT7. The first to seventh active patterns ACT1 to ACT7 may include a semiconductor material. The active pattern ACT may include an inorganic semiconductor (e.g., amorphous silicon or poly-silicon), an organic semiconductor, etc.

The gate insulating layer GIL may be provided on the substrate SUB on which the active pattern ACT is disposed. The gate insulating layer GIL may include at least one of an organic insulating layer and an inorganic insulating layer. In an exemplary embodiment, the gate insulating layer GIL may include an inorganic material including at least one of silicon oxide (SiOx), silicon nitride (SiNx), and silicon oxynitride (SiON), for example.

First to seventh gate electrodes GE1 to GE7 of the respective first to seventh transistors T1 to T7 and the emission control line ELi may be disposed on the gate insulating layer GIL. In an exemplary embodiment, the gate electrodes GE1 to GE7 (hereinafter, referred to as GE) may be conductive patterns having an island shape. In an exemplary embodiment, the gate electrodes GE (refer to FIG. 8) and the emission control line ELi may include metal, alloy, metal nitride, conductive metal oxide, a transparent conductive material, etc., for example. These may be used alone or in a combination thereof.

The first gate electrode GE1 may be the lower electrode LE of the storage capacitor Cst. The fifth gate electrode GE5 and the sixth gate electrode GE6 may be unitary with the emission control line ELi.

The first insulating interlayer IL1 may be provided on the gate insulating layer GIL on which the gate electrodes GE are disposed. The first insulating interlayer IL1 may include at least one of an organic insulating layer and an inorganic insulating layer. In an exemplary embodiment, the first insulating interlayer IL1 may include the same material as that of the gate insulating layer GIL, for example.

The upper electrode UE of the storage capacitor Cst and the first power line (first conductive pattern) PL1 may be disposed on the first insulating interlayer IL1. The upper electrode UE may cover the lower electrode LE. The upper electrode UE along with the lower electrode LE may constitute the storage capacitor Cst with the first insulating interlayer IL1 interposed therebetween. The upper electrode UE may be a portion of the first power line PL1. The first power line PL1 may extend in the first direction DR1. The first power line PL1 may transfer the first power voltage ELVDD.

The upper electrode UE and the first power line PL1 may include the same material. In an exemplary embodiment, the upper electrode UE and the first power line PL1 may include metal, alloy, metal nitride, conductive metal oxide, a transparent conductive material, etc., for example.

The second insulating interlayer IL2 may be provided on the first insulating interlayer IL1 on which the upper electrode UE and the first power line PL1 are disposed. The second insulating interlayer IL2 may include at least one of an organic insulating layer and an inorganic insulating layer.

The first to third scan lines GI, GW, and GB (i.e., SLi−1 and SLi), the second power line (second conductive pattern) PL2, and the first initialization line (first initialization conductive pattern) VIL1 may be disposed on the second insulating interlayer IL2. The first to third scan lines GI, GW, and GB, the second power line PL2, and the first initialization line VIL1 may extend in the first direction DR1. The first to third scan lines GI, GW, and GB, the second power line PL2, and the first initialization line VIL1 may include the same material including a low-resistance metal. In an exemplary embodiment, the low-resistance metal may have an aluminum alloy structure in which titanium (Ti), AL, and titanium (Ti) are sequentially stacked. However, this is merely illustrative, and the low-resistance metal is not limited thereto.

The first to third scan lines GI, GW, and GB (i.e., SLi−1 and SLi) may be connected to gate electrodes corresponding thereto through the contact holes CNT3 to CNT6 penetrating the first and second insulating interlayers IL1 and IL2. The second power line PL2 may be connected to the first power line PL1 through the first contact hole CNT1 penetrating the first and second insulating interlayers IL1 and IL2. The first initialization line VIL1 may be connected to the fourth and seventh gate electrodes GE4 and GE7 through the seventh contact hole CNT7 penetrating the first and second insulating interlayers IL1 and IL2.

The third insulating interlayer IL3 may be provided on the second insulating interlayer IL2 on which the first to third scan lines GI, GW, and GB, the second power line (second conductive pattern) PL2, and the first initialization line VIL1 are disposed. The third insulating interlayer IL3 may include at least one of an organic insulating layer and an inorganic insulating layer.

The third power line (third conductive pattern) PL3, the second initialization line (second initialization conductive pattern) VIL2, and the data line DLj may be disposed on the third insulating interlayer IL3. The third power line PL3, the second initialization line VIL2, and the data line DLj may extend in the second direction DR2. The third power line PL3, the second initialization line VIL2, and the data line DLj may include the same material including a low-resistance metal.

The third power line PL3 may be connected to the second power line PL2 through the second contact hole CNT2 penetrating the third insulating interlayer IL3. The second initialization line VIL2 may be connected to the first initialization line VIL1 through the eighth contact hole CNT8 penetrating the third insulating interlayer IL3. The data line DLj may be connected to the source electrode SE2 (or drain electrode) of the second transistor T2 through a twelfth contact hole CNT12 penetrating the third insulating interlayer IL3.

The protective layer PSV may be provided on the third insulating interlayer IL3 on which the third power line PL3, the second initialization line VIL2, and the data line DLj are disposed. The protective layer PSV may include at least one of an organic insulating layer and an inorganic insulating layer. In an exemplary embodiment, the protective layer PSV may include the organic insulating layer, for example.

An organic light emitting diode OLED may be provided on the protective layer PSV. The organic light emitting diode OLED may include a first electrode AD, a second electrode CD, and an emitting layer EML provided between the first electrode AD and the second electrode CD.

The first electrode AD may be disposed on the protective layer PSV. The first electrode AD may be connected to a first bridge pattern BRP1 through a tenth contact hole CNT10 penetrating the protective layer PSV. The first bridge pattern BRP1 may be a conductive pattern for connecting the source electrode of the seventh transistor T7 and the first electrode AD. The first bridge pattern BRP1 may be disposed on the third insulating interlayer IL3.

The first bridge pattern BRP1 may be connected to a second bridge pattern BRP2 through a ninth contact hole CNT9 penetrating the third insulating interlayer IL3. The second bridge pattern BRP2 may be a conductive pattern disposed on the second insulating interlayer IL2. The second bridge pattern BRP2 may be connected to the source electrode SE7 of the seventh transistor T7 (and the drain electrode of the sixth transistor T6) through an eleventh contact hole CNT11 sequentially penetrating the gate insulating layer GIL, the first insulating interlayer IL', and the second insulating interlayer IL2.

Therefore, the first electrode AD may be finally connected to the source electrode SE7 of the seventh transistor T7 and the drain electrode of the sixth transistor T6 through the first and second bridge patterns BRP1 and BRP2.

A pixel defining layer PDL that defined a light emitting region to correspond to each pixel may be provided on the protective layer PSV on which the first electrode AD is disposed. The pixel defining layer PDL may expose an upper surface of the first electrode AD and protrude from the protective layer PSV along the circumference of the pixel PX. In an exemplary embodiment, the light emitting region may be defined as the upper surface of the first electrode AD, which is exposed by the pixel defining layer PDL.

The emitting layer EML may be provided on the exposed first electrode AD, and the second electrode CD may be provided on the emitting layer EML. An encapsulation layer ECL covering the second electrode CD may be provided over the second electrode CD.

One of the first electrode AD and the second electrode CD may be an anode electrode, and the other of the first electrode AD and the second electrode CD may be a cathode electrode. In an exemplary embodiment, the first electrode AD may be the anode electrode, and the second electrode CD may be the cathode electrode, for example.

The first electrode AD may be provided using metal, alloy, metal nitride, conductive metal oxide, a transparent conductive material, etc. These may be used alone or in a combination thereof. The pixel defining layer PDL may include an organic material or inorganic material. In exemplary embodiments, the pixel defining layer PDL may be provided using the organic material. The second electrode CD may be provided using metal, alloy, metal nitride, conductive metal oxide, a transparent conductive material, etc. These may be used alone or in a combination thereof.

The emitting layer EML may have a multi-layered thin film structure including a light generation layer ("LGL"). The emitting layer EML may include a hole injection layer ("HIL"), a hole transport layer ("HTL"), the LGL, a hole blocking layer ("HBL"), an electron transport layer ("ETL"), and an electron injection layer ("EIL"). In addition, the HIL, the HTL, the HBL, the ETL, and the EIL in the emitting layer EML may be common layers commonly disposed in adjacent pixels PX.

In an exemplary embodiment, the color of light generated in the LGL may be one of red, green, blue, and white, but the invention is not limited thereto. In an exemplary embodiment, the color of light generated in the LGL may be one of magenta, cyan, and yellow, for example.

Figure 7:
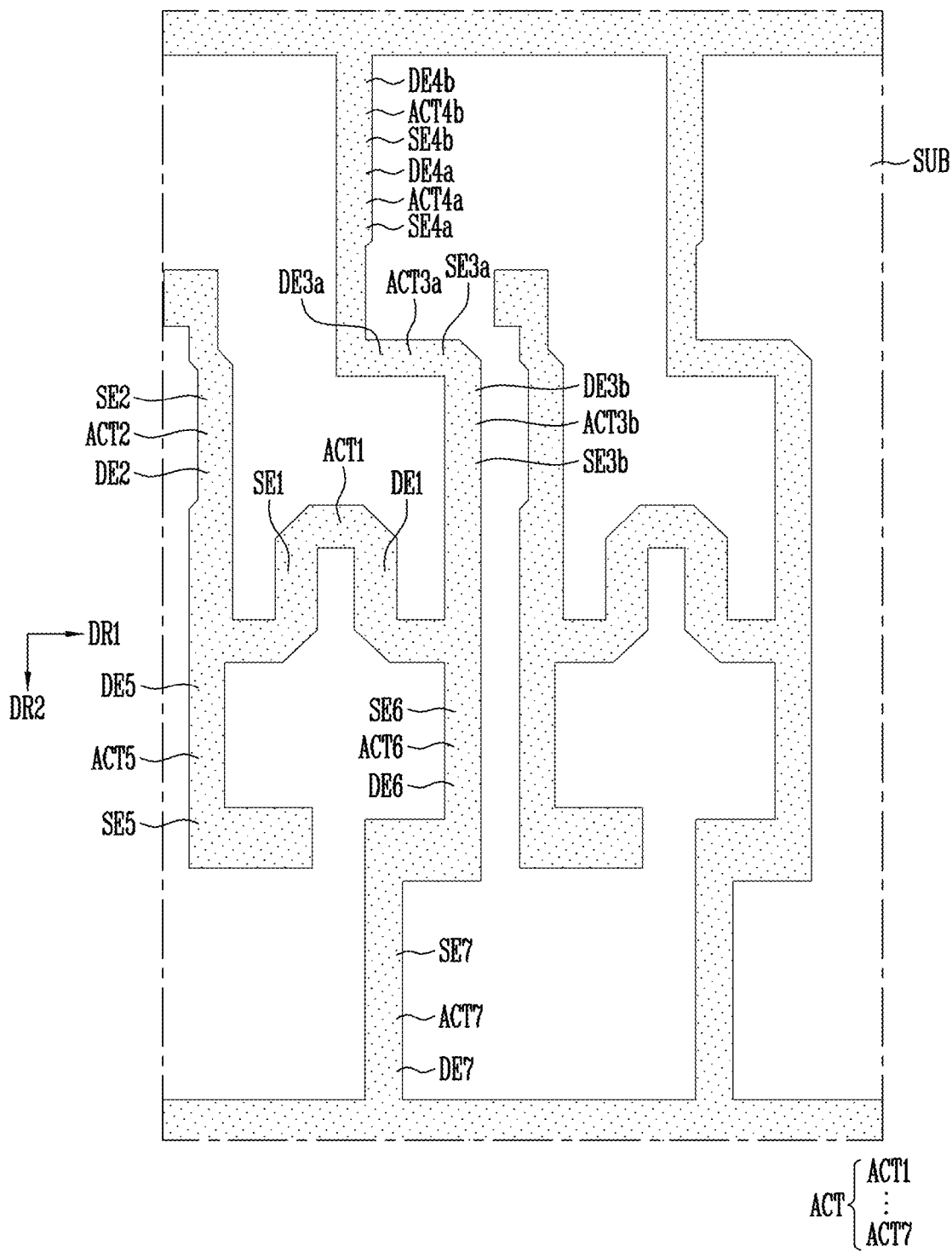
FIG. 7 is a plan view illustrating active patterns, source electrodes, and drain electrodes, which are shown in FIGS. 3 to 6.
Figure 8:
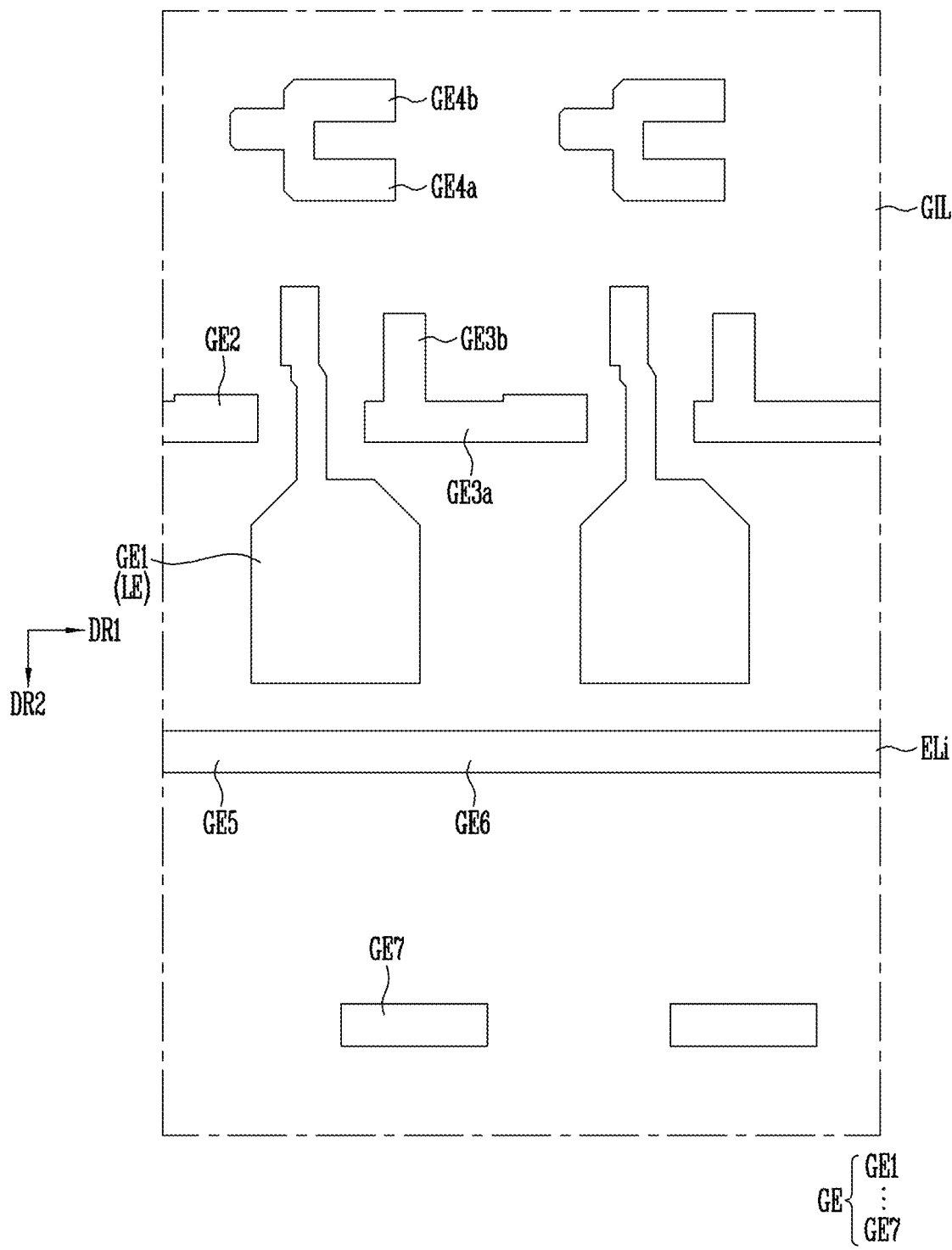
FIG. 8 is a plan view illustrating gate electrodes and an emission control line, which are shown in FIGS. 3 to 6.

FIG. 7 is a plan view illustrating the active patterns, the source electrodes, and the drain electrodes, which are shown in FIGS. 3 to 6. FIG. 8 is a plan view illustrating the gate electrodes and the emission control line, which are shown in FIGS. 3 to 6.

Referring to FIGS. 2 to 8, a semiconductor layer including the first to seventh active patterns ACT1 to ACT7, first to seventh source electrodes SE1 to SE7, and first to seventh drain electrodes DE1 to DE7 may be provided on the substrate SUB.

The first to seventh active patterns ACT1 to ACT7 may be disposed in the same layer through the same process. The first to seventh active patterns ACT1 to ACT7 may correspond to the first to seventh transistors T1 to T7, respectively.

The first to seventh source electrodes SE1 to SE7 may correspond to the first to seventh transistors T1 to T7, respectively. The first to seventh drain electrodes DE1 to DE7 may correspond to the first to seventh transistors T1 to T7, respectively.

In an exemplary embodiment, the first to seventh active patterns ACT1 to ACT7 may include a semiconductor layer undoped with an impurity, and the first to seventh source electrodes SE1 to SE7 and the first to seventh drain electrodes DE1 to DE7 may include a semiconductor layer doped with the impurity.

One end of the first active pattern ACT1 may be connected to the first source electrode SE1, and the other end of the first active pattern ACT1 may be connected to the first drain electrode DE1. One end of the second active pattern ACT2 may be connected to the second source electrode SE2, and the other end of the second active pattern ACT2 may be connected to the second drain electrode DE2. One end of the third active pattern ACT3 may be connected to the third source electrode SE3, and the other end of the third active pattern ACT3 may be connected to the third drain electrode DE3. One end of the fourth active pattern ACT4 may be connected to the fourth source electrode SE4, and the other end of the fourth active pattern ACT4 may be connected to the fourth drain electrode DE4. One end of the fifth active pattern ACT5 may be connected to the fifth source electrode SE5, and the other end of the fifth active pattern ACT5 may be connected to the fifth drain electrode DE5. One end of the sixth active pattern ACT6 may be connected to the sixth source electrode SE6, and the other end of the sixth active pattern ACT6 may be connected to the sixth drain electrode DE6. One end of the seventh active pattern ACT7 may be connected to the seventh source electrode SE7, and the other end of the seventh active pattern ACT7 may be connected to the seventh drain electrode DE7.

The first active pattern ACT1 may have a bar shape extending in the first direction DR1, and have a shape bent plural times along the extending length direction. The first active pattern ACT1 may overlap the first gate electrode GE1 in a plan view. The first active pattern ACT1 is provided long, so that a channel region of the first transistor T1 may be provided long. Accordingly, the driving range of a gate voltage applied to the first transistor T1 may be widened.

In an exemplary embodiment, the third transistor T3 and the fourth transistor T4 may be provided in a dual gate structure so as to prevent leakage current. The third transistor T3 may include a 3ath transistor and a 3bth transistor. The 3ath transistor may include a 3ath gate electrode GE3$a$, a 3ath active pattern ACT3$a$, a 3ath source electrode SE3$a$, and a 3ath drain electrode DE3$a$. The 3bth transistor may include a 3bth gate electrode GE3$b$, a 3bth active pattern ACT3$b$, a 3bth source electrode SE3$b$, and a 3bth drain electrode DE3$b$. The fourth transistor T4 may include a 4ath transistor and a 4bth transistor. The 4ath transistor may include a 4ath gate electrode GE4$a$, a 4ath active pattern ACT4$a$, a 4ath source electrode SE4$a$, and a 4ath drain electrode DE4$a$. The 4bth transistor may include a 4bth gate electrode GE4$b$, a 4bth active pattern ACT4$b$, a 4bth source electrode SE4$b$, and a 4bth drain electrode DE4$b$.

The first to seventh gate electrode GE1 to GE7, the lower electrode LE of the storage capacitor Cst, and an emission control line ELi may be disposed on the gate insulating layer GIL on which the semiconductor layer is disposed. The first to seventh active patterns ACT1 to ACT7 may correspond to portions overlapping the first to seventh gate electrodes GE1 to GE7 of the semiconductor layer, respectively.

The first to seventh gate electrode GE1 to GE7, the lower electrode LE of the storage capacitor Cst, and an emission control line ELi may include the same material in the same layer through the same process.

In an exemplary embodiment, the first, second, third, fourth, and seventh gate electrodes GE1, GE2, GE3, GE4, and GE7 may be conductive patterns having an island shape. Accordingly, the influence caused by an unintended antenna effect may be reduced.

That is, unlike the disposition of the existing scan line disposed in the same layer as the gate electrodes, the scan lines may be disposed in a layer different from that of the gate electrode. The first, second, third, fourth, and seventh gate electrodes GE1, GE2, GE3, GE4, and GE7 may be connected to the upper scan lines through contact holes, respectively.

The first gate electrode GE1 may be unitary with the lower electrode LE, and the fifth gate electrode GE5 and the sixth gate electrode GE6 may be unitary with the emission control line ELi.

However, this is merely illustrative, and the disposition of the emission control line ELi is not limited thereto. In an exemplary embodiment, the emission control line ELi may include the same material in the same layer through the same process as the scan lines and the second conductive pattern (second power line) PL2. In an exemplary embodiment, the emission control line ELi may be disposed on the second insulating interlayer IL2, and be electrically connected to the fifth gate electrode GE5 and the sixth gate electrode GE6 through a predetermined contact hole, for example.

Figure 9:
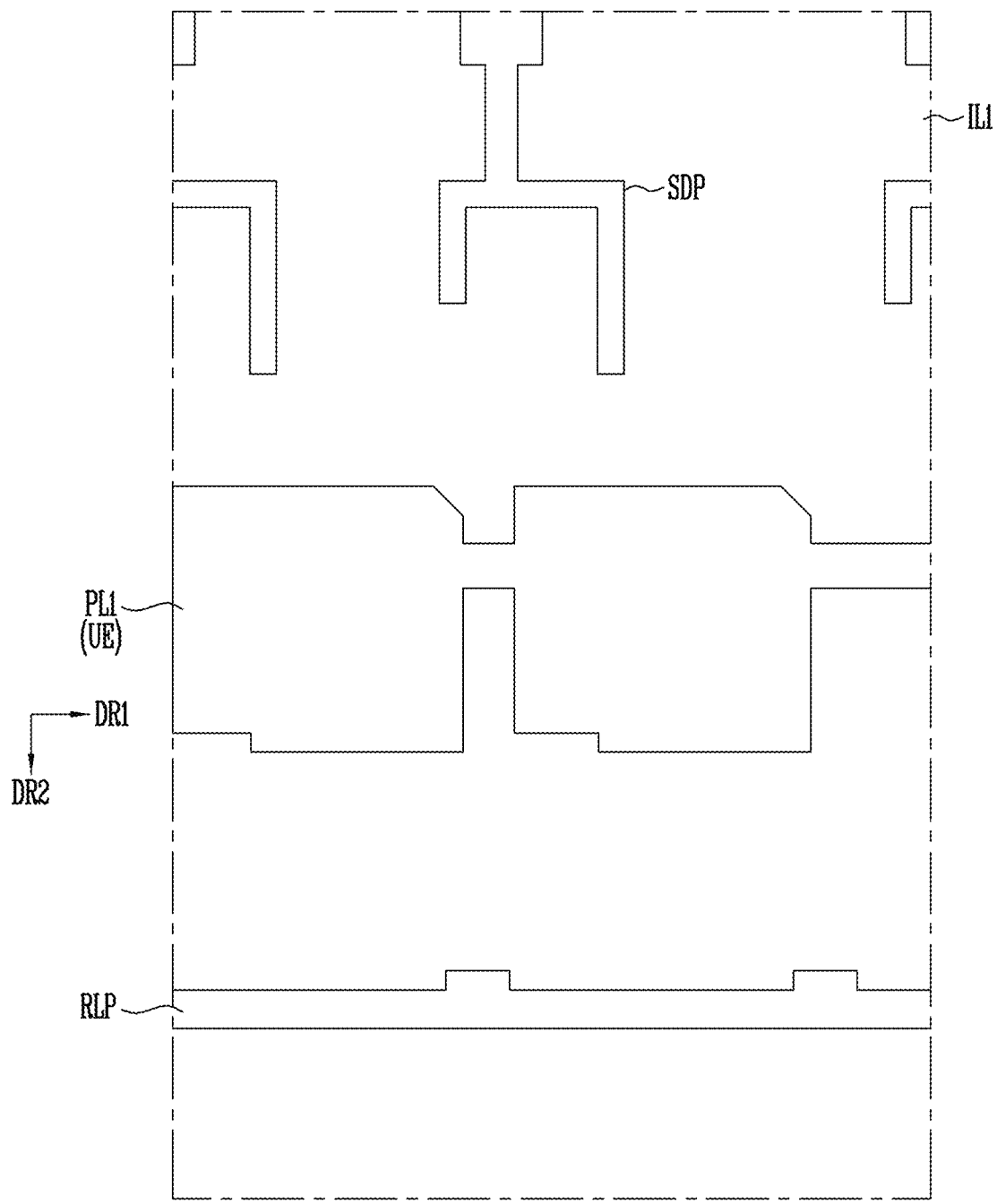
FIG. 9 is a plan view illustrating a first conductive pattern of a power line, shown in FIGS. 3 to 6.

FIG. 9 is a plan view illustrating the first conductive pattern of the power line, shown in FIGS. 3 to 6.

Referring to FIGS. 2 to 9, the first power line (first conductive pattern) PL1 and the upper electrode UE of the storage capacitor Cst may be disposed on the first insulating interlayer IL1 that covers the first to seventh gate electrodes GE1 to GE7, the lower electrode LE of the storage capacitor Cst, and the emission control line ELi.

Figure 12:
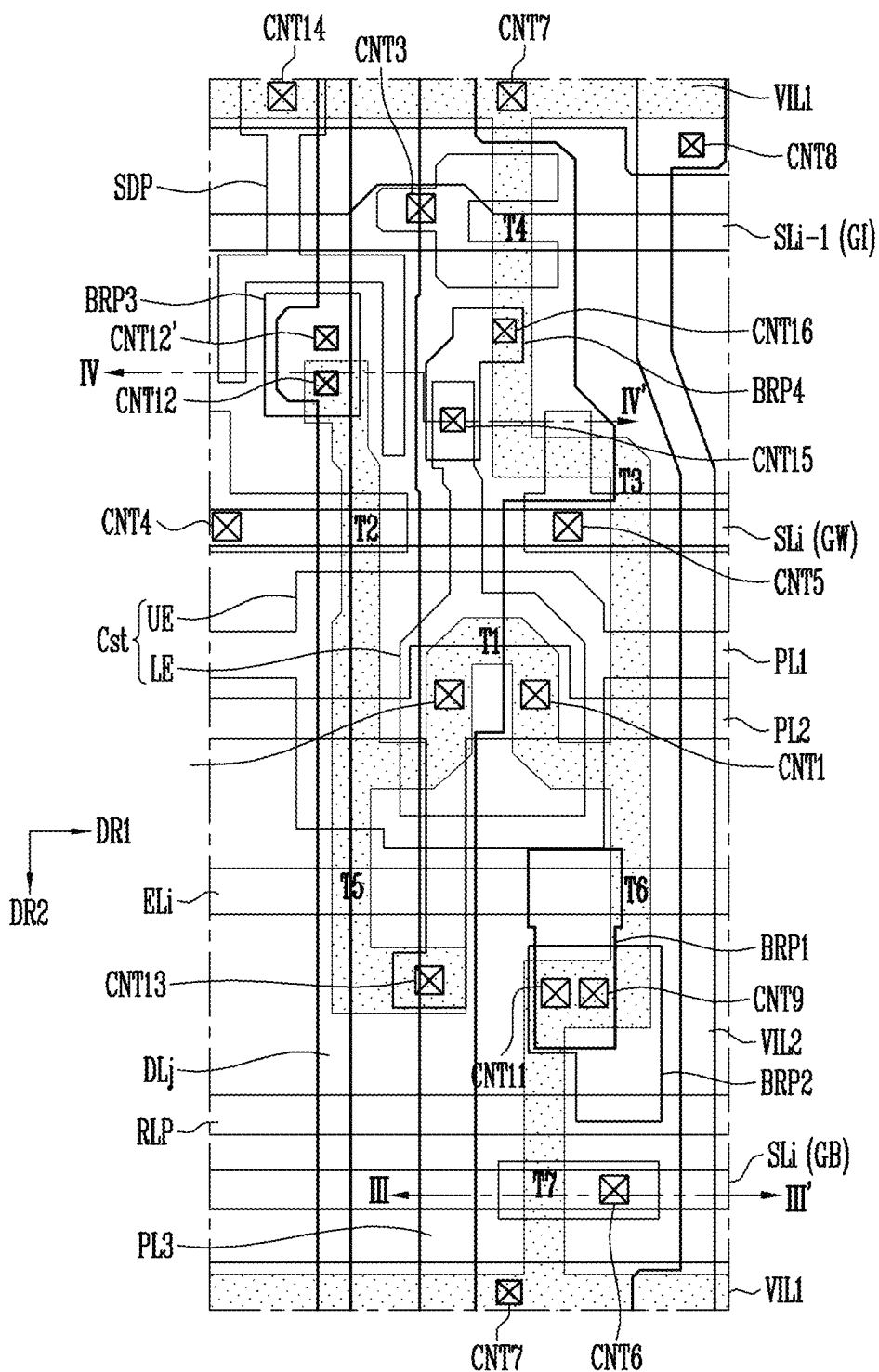
FIG. 12 is a plan view illustrating another example of the pixel of FIG. 2.
Figure 13:
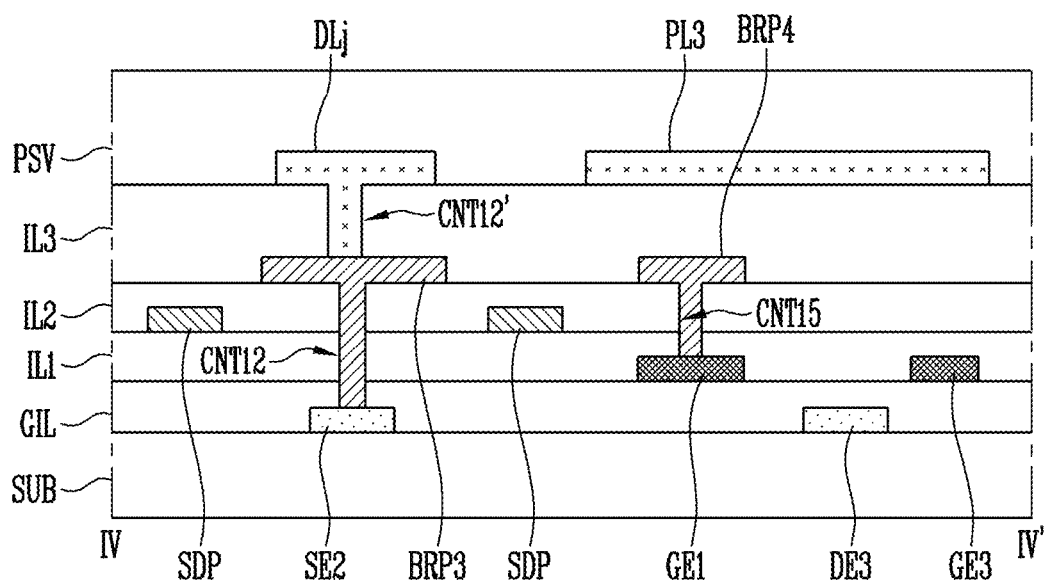
FIG. 13 is a cross-sectional view taken along line IV-IV' of FIG. 12.

In an exemplary embodiment, although not shown in FIG. 3, a shielding pattern SDP and a repair line pattern RLP may be further disposed on the first insulating interlayer IL1 (shown in FIGS. 12 and 13). The first power line PL1, the upper electrode UE of the storage capacitor Cst, the shielding pattern SDP, and the repair line pattern RLP may include the same material in the same layer through the same process.

The first power line PL1 may extend in the first direction DR1, and transfer the first power voltage ELVDD.

The upper electrode UE may be unitary with the first power line PL1. That is, the storage capacitor Cst may be formed by the lower electrode LE and the upper electrode UE, which are disposed with the first insulating interlayer IL1 interposed therebetween. In an exemplary embodiment, the upper electrode UE may have an area larger than that of the lower electrode LE. In addition, an opening (hole) is not defined in the upper electrode UE.

In a plan view, the shielding pattern SDP may be disposed between the data line DLj and a gate node (gate electrode GE1) of the first transistor T1 to be spaced apart from the data line DLj and the gate node (gate electrode GE1) of the first transistor T1. According to the disposition of the shielding pattern SDP, the electrical influence (e.g., coupling capacitance) between the data line DLj and the gate node may be reduced. Thus, the image crosstalk may be minimized.

The repair line pattern RLP may extend in the first direction DR1. The repair line pattern RLP may connect an organic light emitting diode that has been connected to a pixel circuit determined as a defective pixel circuit to a repair pixel circuit at the outside of the display region. In an exemplary embodiment, the defective pixel circuit is disconnected from the organic light emitting diode, and the corresponding organic light emitting diode may be electrically connected to the repair pixel circuit through the repair line pattern RLP, for example.

Figure 10:
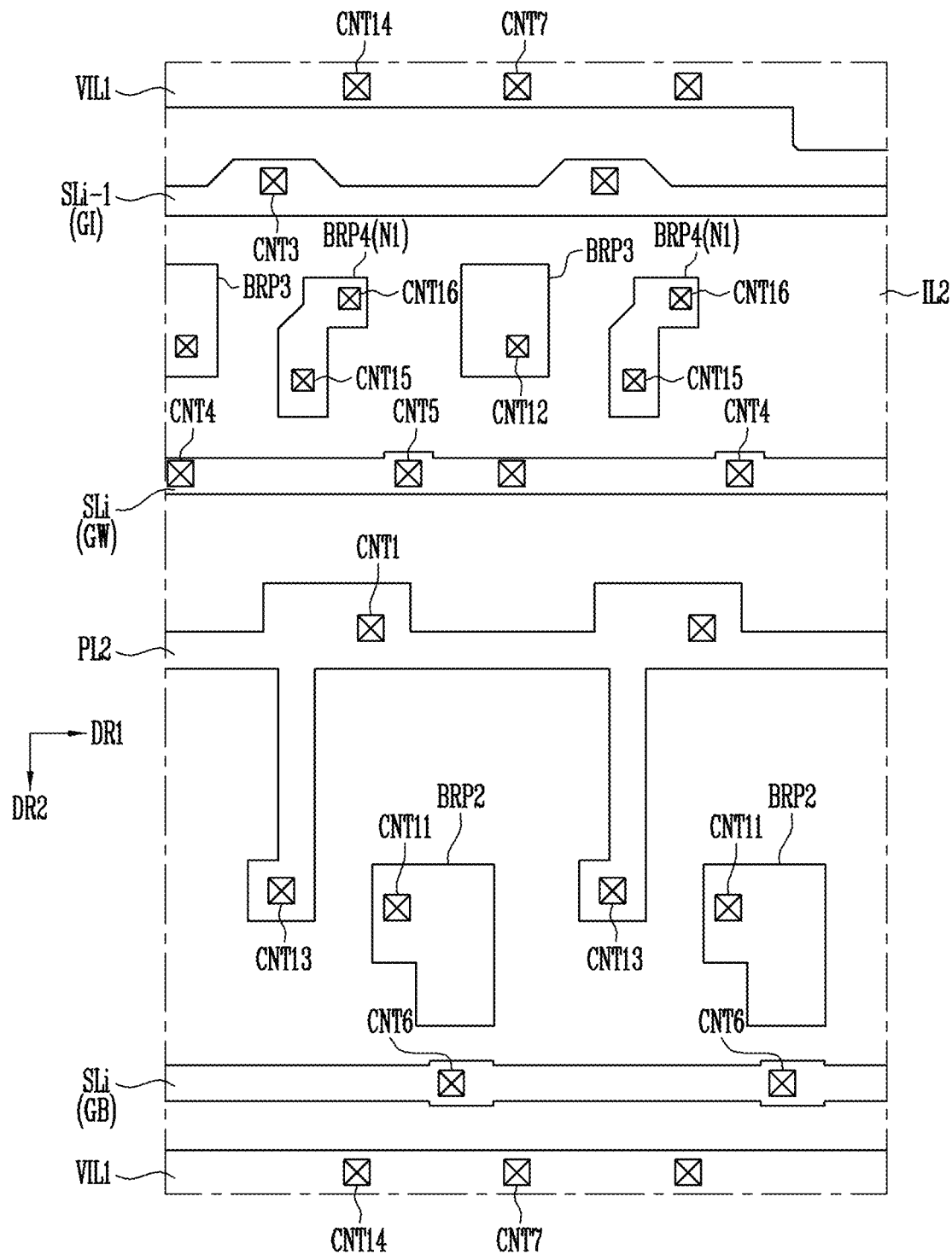
FIG. 10 is a plan view illustrating first to third scan lines, a second conductive pattern of the power line, and a first initialization line, which are shown in FIGS. 3 to 6.

FIG. 10 is a plan view illustrating the first to third scan lines, the second conductive pattern of the power line, and the first initialization line, which are shown in FIGS. 3 to 6.

Referring to FIGS. 2 to 10, the first to third scan lines GI, GW, and GB, the second power line (second conductive pattern) PL2, and the first initialization line (first initialization conductive pattern) VIL1 may be disposed on the second insulating interlayer IL2 covering the first power line PL1 and the upper electrode UE of the storage capacitor Cst.

In an exemplary embodiment, second to fourth bridge patterns BRP2 to BRP4 may be further disposed on the second insulating interlayer IL2.

The second to fourth bridge patterns BRP2 to BRP4, the first to third scan lines GI, GW, and GB, the second power line PL2, and the first initialization line VIL1 may include the same material in the same layer, and be electrically connected to lower conductive layers through a plurality of contact holes.

The first scan line GI may extend in the first direction DR1. The first scan line GI may be connected to the fourth gate electrode GE4 through the third contact hole CNT3.

The second scan line GW may extend in the first direction DR1. The second scan line GW may be connected to the second gate electrode GE2 and the third gate electrode GE3 respectively through the fourth and fifth contact holes CNT4 and CNT5. In an exemplary embodiment, the second scan line GW may be connected to a gate electrode of a third transistor T3 of a pixel on a (j−1)th column and a gate electrode of a second transistor T2 of a pixel on a jth column through the fourth contact hole CNT4, and be connected to a gate electrode of a third transistor T3 of the pixel on the jth column and a gate electrode of a second transistor T2 of a pixel on a (j+1)th column through the fifth contact hole CNT5, for example.

The third scan line GB may extend in the first direction DR1. The third scan line GB may be connected to the seventh gate electrode GE7 through the sixth contact hole CNT6.

As described above, the first to third scan lines GI, GW, and GB may be disposed in a conductive layer (i.e., a layer different from that of the gate electrode) including a low-resistance material (aluminum alloy, etc.), and be connected to the gate electrodes through the contact holes. Thus, the resistance of the first to third scan lines GI, GW, and GB decreases, so that RC delay may be minimized.

The second power line PL2 may extend in the first direction DR1. The second power line PL2 may be connected to the first power line PL1 through the first contact hole CNT1. The second power line PL2 may be connected to the fifth source electrode SE5 through a thirteenth contact hole CNT13. In an exemplary embodiment, the thirteenth contact hole CNT13 may penetrate the gate insulating layer GIL, the first insulating interlayer IL1, and the second insulating interlayer IL2, for example.

In an exemplary embodiment, an area of the first power line PL1 overlapping the lower electrode LE may be larger than that of the second power line PL2 overlapping the lower electrode LE. However, this is merely illustrative, and the areas of the first and second power lines PL1 and PL2 are not limited thereto.

The first and second power lines PL1 and PL2 may be disposed in a double wiring structure in which at least portions of the first and second conductive patterns PL1 and PL2 extend to overlap each other in the horizontal direction. A voltage drop (i.e., an IR drop) of the first power voltage ELVDD in the first direction DR1 may be reduced by the double wiring structure and the second conductive pattern PL2 including the low-resistance metal. Thus, the luminance uniformity of the display device 1000 may be improved.

The first initialization line VIL1 may extend in the first direction DR1. The first initialization line VIL1 may be connected to the seventh drain electrode DE7 (or the seventh source electrode SE7) and the fourth drain electrode DE4 (or the fourth source electrode SE4) through the seventh contact hole CNT7. In an exemplary embodiment, the first initialization line VIL1 may be connected a seventh drain electrode DE7 (or a seventh source electrode SE7) of an ith pixel (i.e., a pixel on an ith row) and a fourth drain electrode DE4 (or a fourth source electrode SE4) of an (i+1)th pixel (i.e., a pixel on an (i+1)th row) through the seventh contact hole CNT7, for example.

In an exemplary embodiment, the first initialization line VIL1 may be connected to the shielding pattern SDP through a fourteenth contact hole CNT14 penetrating the second insulating interlayer IL2. Thus, the shielding pattern SDP is floated to the initialization voltage VINT that is a direct current ("DC") voltage, and accordingly, the electrical influence between the data line DLj and the gate node may be eliminated.

The second bridge pattern BRP2 may be connected to the seventh source electrode SE7 (and the sixth drain electrode DE6) through the eleventh contact hole CNT11 penetrating the gate insulating layer GIL, the first insulating interlayer IL', and the second insulating interlayer IL2. The second bridge pattern BRP2 may mediate electrical connection between the seventh source electrode SE7 and the first electrode AD of the organic light emitting diode OLED.

The third bridge pattern BRP3 may be connected to the second source electrode SE2 through the twelfth contact hole CNT12 penetrating the gate insulating layer GIL, the first insulating interlayer ILL and the second insulating interlayer IL2. The third bridge pattern BRP3 may mediate electrical connection between the second source electrode SE2 and the data line DLj.

The fourth bridge pattern BRP4 may be connected to the first gate electrode GE1 through a fifteenth contact hole CNT15 penetrating the first insulating interlayer IL1, and the second insulating interlayer IL2. Also, the fourth bridge pattern BRP4 may be connected to the third drain electrode DE3 (and the fourth source electrode SE4) through a sixteenth contact hole CNT16 penetrating the gate insulating layer GIL, the first insulating interlayer ILL and the second insulating interlayer IL2. That is, the fourth bridge pattern BRP4 may correspond to the first node N1 of the pixel PX of FIG. 2. The fourth bridge pattern BRP4 may mediate electrical connection between the first gate electrode GE1 and the third drain electrode DE3 (and the fourth source electrode SE4).

Figure 11:
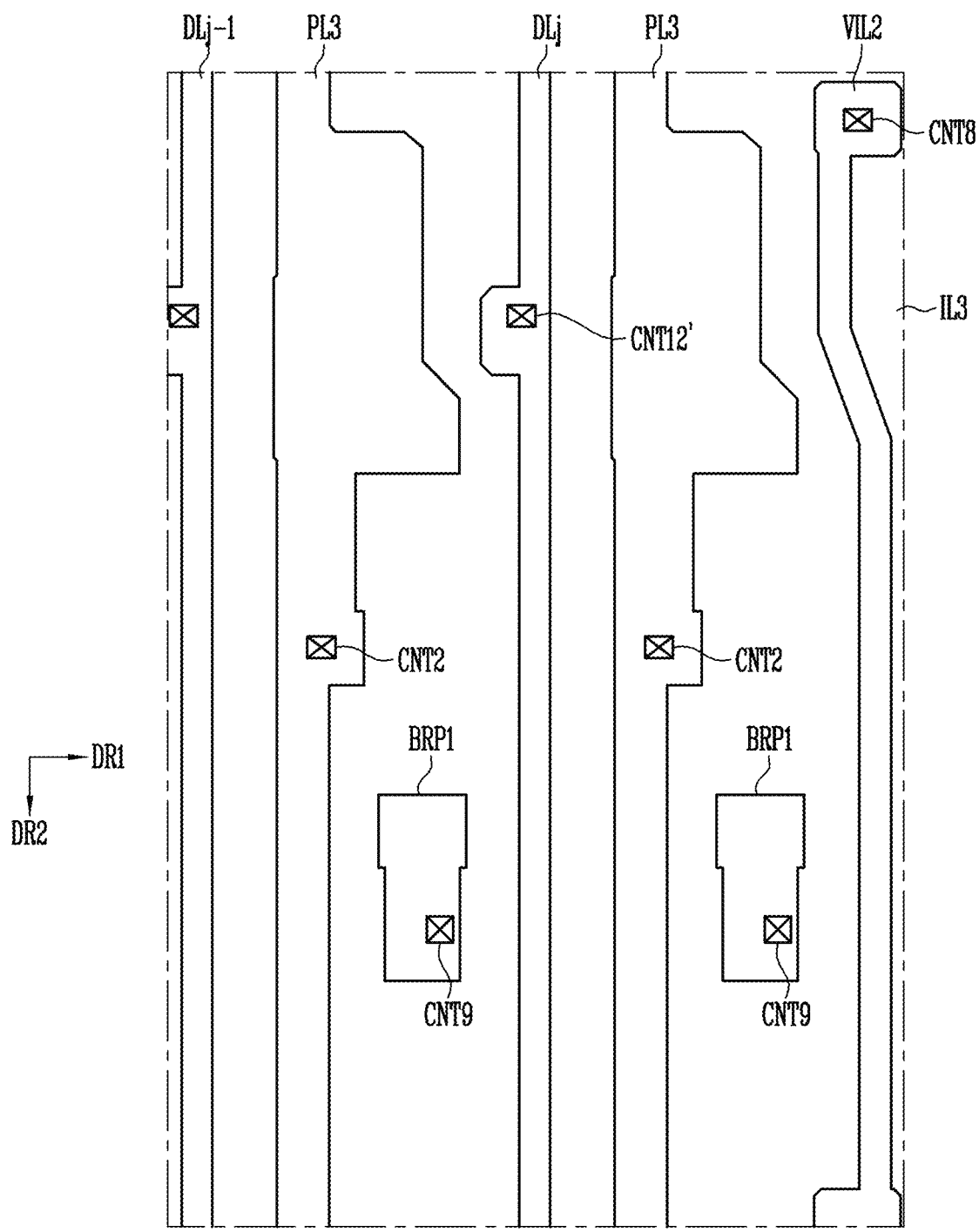
FIG. 11 is a plan view illustrating a third conductive pattern of the power line, a data line, and a second initialization line, which are shown in FIGS. 3 to 6.

FIG. 11 is a plan view illustrating the third conductive pattern of the power line, the data line, and the second initialization line, which are shown in FIGS. 3 to 6.

Referring to FIGS. 2 to 11, data lines DLj-1, DLj, ..., the third power line (third conductive pattern) PL3, and the second initialization line (second initialization conductive pattern) VIL2 may be disposed on the third insulating interlayer IL3 covering the first to third scan lines GI, GW, and GB, the second power line PL2, and the first initialization line VIL1.

In an exemplary embodiment, the first bridge pattern BRP1 may be further disposed on the third insulating interlayer IL3.

The first bridge pattern BRP1, the data lines DLj-1, DLj, ..., the third power line PL3, and the second initialization line VIL2 may include the same material in the same layer through the same process, and be electrically connected to lower conductive layers through a plurality of contact holes.

The data line DLj may extend in the second direction DR2. The data line DLj may be connected to the third bridge pattern BRP3 through a contact hole CNT12' penetrating the third insulating interlayer IL3. Therefore, the data line DLj may be finally connected to the second source electrode SE2. A data signal transferred through the data line DLj may be supplied to the pixel PX through the second transistor T2 (e.g., the second source electrode SE2).

The third power line PL3 may extend in the second direction DR2. The third power line PL3 may transfer the first power voltage ELVDD in the second direction DR2.

The third power line PL3 may be connected to the second power line PL2 through the second contact hole CNT2 penetrating the third insulating interlayer IL3. The third power line PL3 may be finally connected to the first power line PL1, the fifth source electrode SE5, and the upper electrode UE of the storage capacitor Cst.

According to the connection relationship of the first to third power lines PL1 to PL3, the power line PL may be disposed in a mesh structure in the display region DA of FIG. 1.

The second initialization line VIL2 may extend in the second direction DR2. The second initialization line VIL2 may be connected to the first initialization line VIL1 through the eighth contact hole CNT8 penetrating the third insulating interlayer IL3. According to the connection relationship of the first and second initialization lines VIL1 and VIL2, the initialization line VIL (refer to FIG. 2) may be disposed in a mesh structure in the display region DA of FIG. 1.

In an exemplary embodiment, one second initialization line VIL2 may be disposed per two pixel columns so as to secure an aperture ratio.

The first bridge pattern BRP1 may be connected to the second bridge pattern BRP2 through the ninth contact hole CNT9 penetrating the third insulating interlayer IL3. The first bridge pattern BRP1 along with the second bridge pattern BRP2 may mediate electrical connection between the seventh source electrode SE7 and the first electrode AD of the organic light emitting diode OLED.

FIG. 12 is a plan view illustrating another example of the pixel of FIG. 2. FIG. 13 is a cross-sectional view taken along line IV-IV' of FIG. 12.

In FIG. 12, components identical to those described with reference to FIG. 3 are designated by like reference numerals, and their overlapping descriptions will be omitted. In addition, the pixel of FIG. 12 may have a configuration substantially identical or similar to that of the pixel of FIG. 3, except a shielding pattern SDP and a repair line pattern RLP.

Referring to FIGS. 2 to 12, the display device 1000 may include a substrate SUB, a plurality of conductive lines, and a pixel PX connected to the conductive lines.

The shielding pattern SDP and the repair line pattern RLP may include the same material in the same layer through the same process as the first power line PL1 and the upper electrode UE of the storage capacitor Cst.

In a plan view, the shielding pattern SDP may be disposed between the data line DLj and the gate node (N1 of FIG. 2) of the first transistor T1 (e.g., the fourth bridge pattern BRP4) to be spaced apart from the data line DLj and the gate node N1 of the first transistor T1. The shielding pattern SDP may be connected to the first initialization line VIL1 through the fourteenth contact hole CNT14, and one end of the shielding pattern SDP may be floated.

According to the disposition of the shielding pattern SDP, the electrical influence (e.g., coupling capacitance) between the data line DLj and the gate node may be reduced. Thus, the image crosstalk may be minimized.

The repair line pattern RLP may extend in the first direction DR1. The repair line pattern RLP may connect an organic light emitting diode that has been connected to a pixel circuit determined as a defective pixel circuit to a repair pixel circuit at the outside of the display region. In an exemplary embodiment, the defective pixel circuit is disconnected from the organic light emitting diode, and the corresponding organic light emitting diode may be electrically connected to the repair pixel circuit through the repair line pattern RLP, for example.

Figure 14:
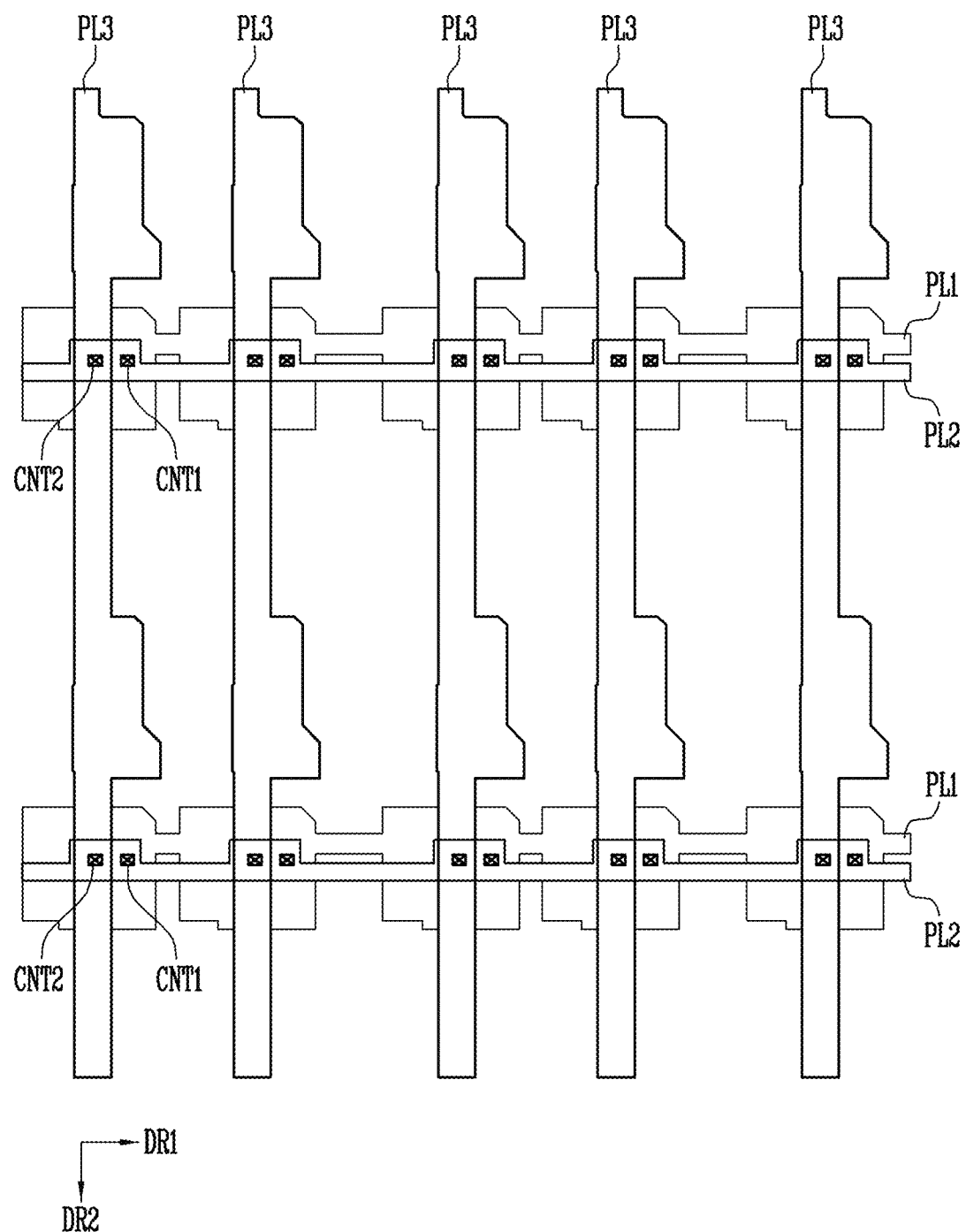
FIG. 14 is a plan view illustrating an example of the power line included in the display device of FIG. 1.

FIG. 14 is a plan view illustrating an example of the power line included in the display device of FIG. 1.

Referring to FIGS. 1, 3, 9, 10, 11, and 14, the display device 1000 may include a plurality of power lines PL that provide the first power voltage ELVDD to the pixels PX.

The power line PL may include first to third conductive patterns PL1 to PL3 (hereinafter, referred to as first to third power lines) electrically connected to each other.

The first power line PL1 may be disposed on the first insulating interlayer IL1 to extend in the first direction DR1. In an exemplary embodiment, the first direction may be a horizontal direction (or pixel row direction), and the second direction DR2 may be a vertical direction (or pixel column direction) intersecting the first direction DR1, for example. In an exemplary embodiment, a portion of the first power line PL1 may be the upper electrode UE of the storage capacitor Cst. An area of the first power line PL1 may be larger than that of the second power line PL2. Thus, the resistance of the first power line PL1 may be decreased.

The second power line PL2 may be disposed on the second insulating interlayer IL2 to extend in the first direction DR1. The second power line PL2 may be electrically connected to the first power line PL1 through the first contact hole CNT1.

Since the second power line PL2 includes a low-resistance metal, a width (or area) of the second power line PL2 in the second direction DR2 may be smaller than that of the first power line PL1 in the second direction DR2.

The third power line PL3 may be disposed on the third insulating interlayer IL3 to extend in the second direction DR2. The third power line PL3 may be electrically connected to the second power line PL2 through the second contact hole CNT2. Consequently, all the first to third power lines PL1 to PL3 may be electrically connected to each other. However, this is merely illustrative, and the stacking order of the first to third power lines PL1 to PL3 is not limited thereto. In addition, the power line extending in the second direction DR2 may have a double wiring structure. In addition, the power lines may have a triple or more, i.e., multiple overlapping wiring structure in one direction.

As described above, the power line PL may have a mesh structure provided with three conductive layers by connection of the first to third power lines PL1 to PL3. The first and second power lines PL1 and PL2 may be disposed in a double wiring structure in which at least portions of the first and second conductive patterns PL1 and PL2 extend to overlap each other in the first direction DR1. Thus, a voltage drop (i.e., an IR drop) of the first power voltage ELVDD may be reduced. Accordingly, the luminance uniformity of the display device 1000 may be improved.

Figure 15:
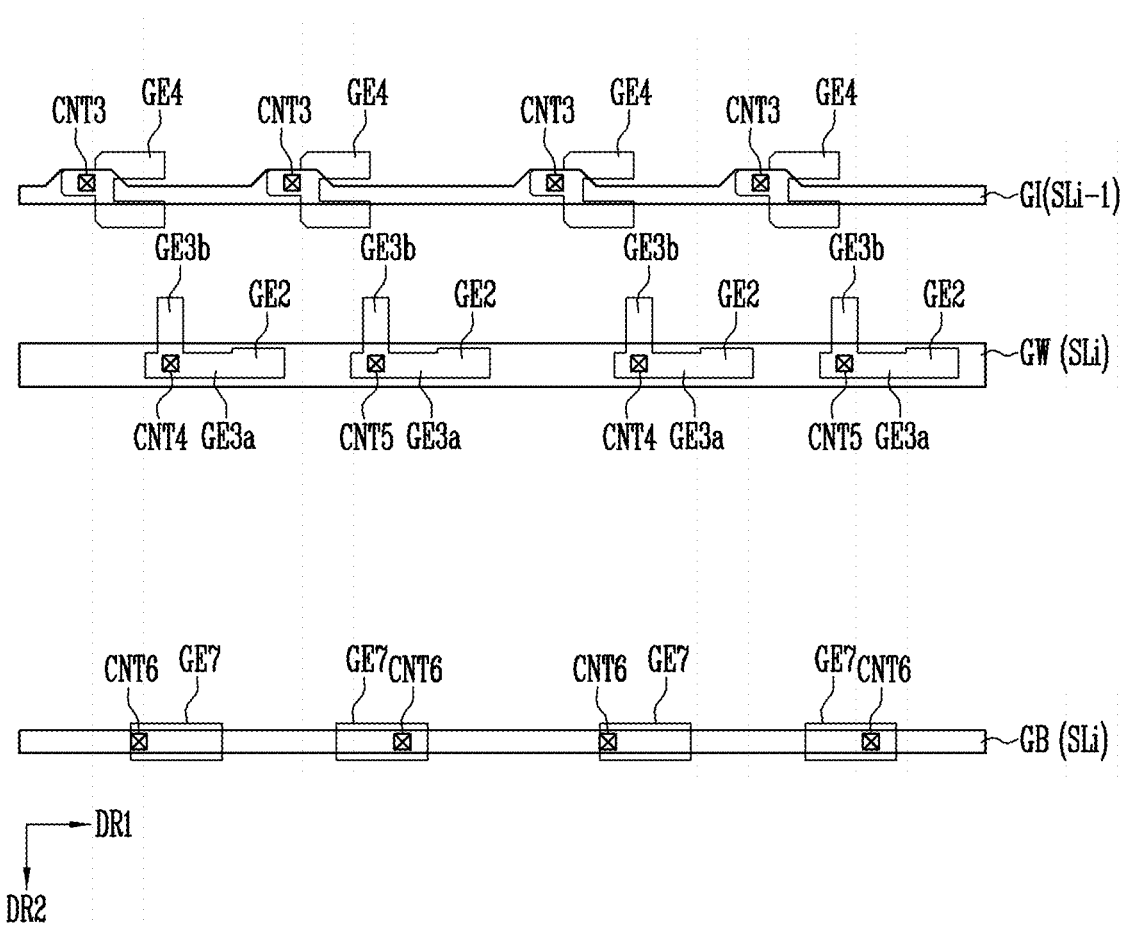
FIG. 15 is a plan view illustrating an example of the scan lines included in the display device of FIG. 1.

FIG. 15 is a plan view illustrating an example of the scan lines included in the display device of FIG. 1.

Referring to FIGS. 1, 2, 3, 8, 10, and 15, the display device 1000 may include a plurality of scan lines GI, GW, and GB that provide a scan signal to the pixels PX.

The first to third scan lines GI, GW, and GB may extend in the first direction DR1, and be disposed on the second insulating interlayer IL2. The first to third scan lines GI, GW, and GB may be electrically connected to the gate electrodes GE2, GE3, GE4, and GE7 corresponding thereto through predetermined contact holes CNT3, CNT4, CNT5, and CNT6.

The first to third scan lines GI, GW, and GB include a conductive layer including a low-resistance material, so that the resistance of the first to third scan lines GI, GW, and GB decreases. Thus, the RC delay of a scan signal may be minimized. The scan lines GI, GW, and GB are provided through a bridge structure between the gate electrode and the conductive patterns of the second insulating interlayer IL2, so that the influence from peripheral interference and static electricity may be reduced.

In an exemplary embodiment, the emission control line ELi may also be disposed on the second insulating interlayer IL2. That is, the emission control line ELi may include the same material in the same layer as the first to third scan lines GI, GW, and GB.

Figure 16:
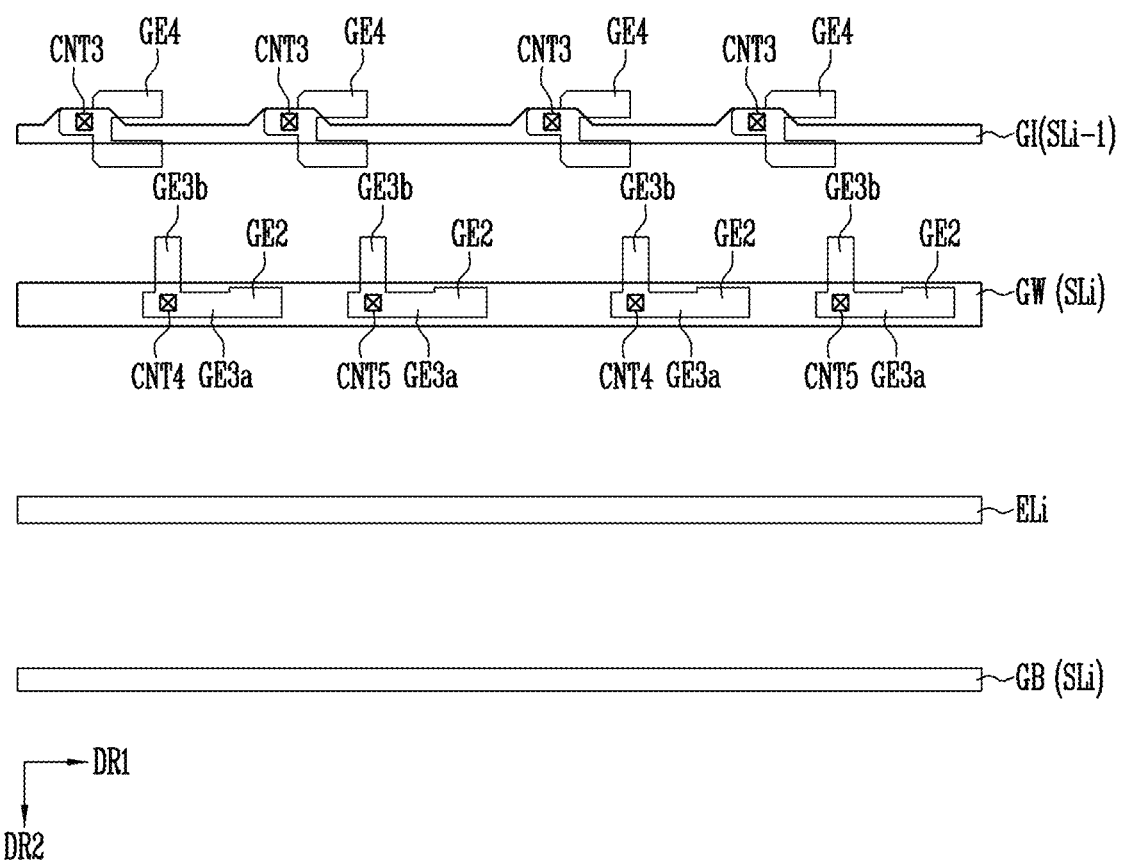
FIG. 16 is a plan view illustrating another example of the scan lines included in the display device of FIG. 1.

FIG. 16 is a plan view illustrating another example of the scan lines included in the display device of FIG. 1.

In FIG. 16, components identical to those described with reference to FIG. 15 are designated by like reference numerals, and their overlapping descriptions will be omitted. In addition, the scan lines of FIG. 16 may have a configuration substantially identical or similar to that of the scan lines of FIG. 15, except a third scan line GB.

Referring to FIG. 16, the third scan line GB may include the same material in the same layer through the same process as the emission control line ELi.

The third scan line GB is used to control initialization of the first electrode AD of the organic light emitting diode OLED before or after data is written, and less receives the influence of RC delay. In addition, an emission control signal transferred to the emission control line ELi has a sufficiently long turn-on/turn-off state, and hence the emission control line ELi less receives the influence of RC delay. Therefore, the third scan line GB and the emission control line ELi may be unitary with a predetermined gate electrode in the same layer as the gate electrode.

However, this is merely illustrative, and at least one of the first and second scan lines GI and GW may be disposed in the same layer as the gate electrode. The scan line that is not disposed in the same layer as the gate electrode may be disposed in the same layer as the second conductive pattern PL2.

Figure 17:
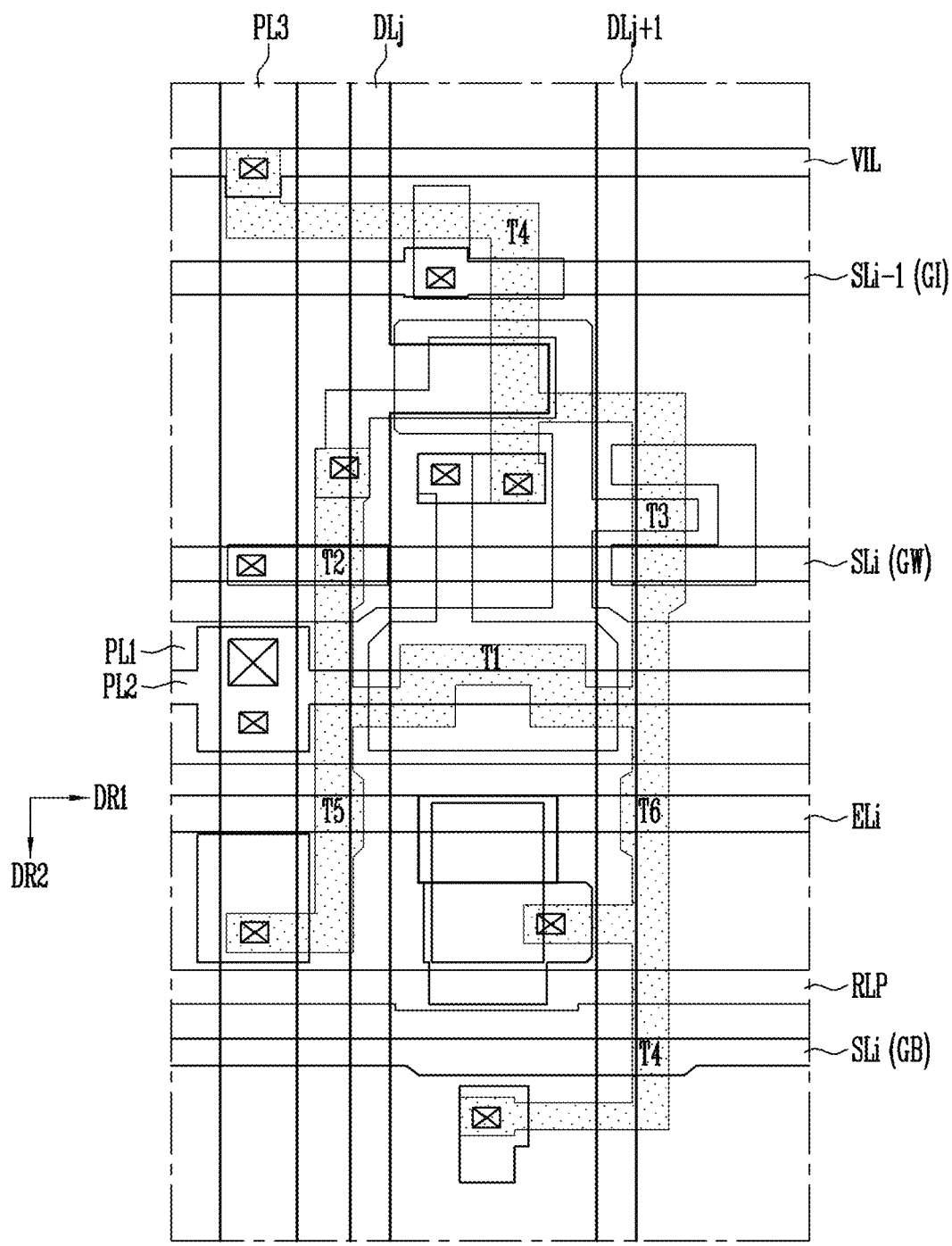
FIG. 17 is a plan view illustrating an example of the pixel of FIG. 2.
Figure 18:
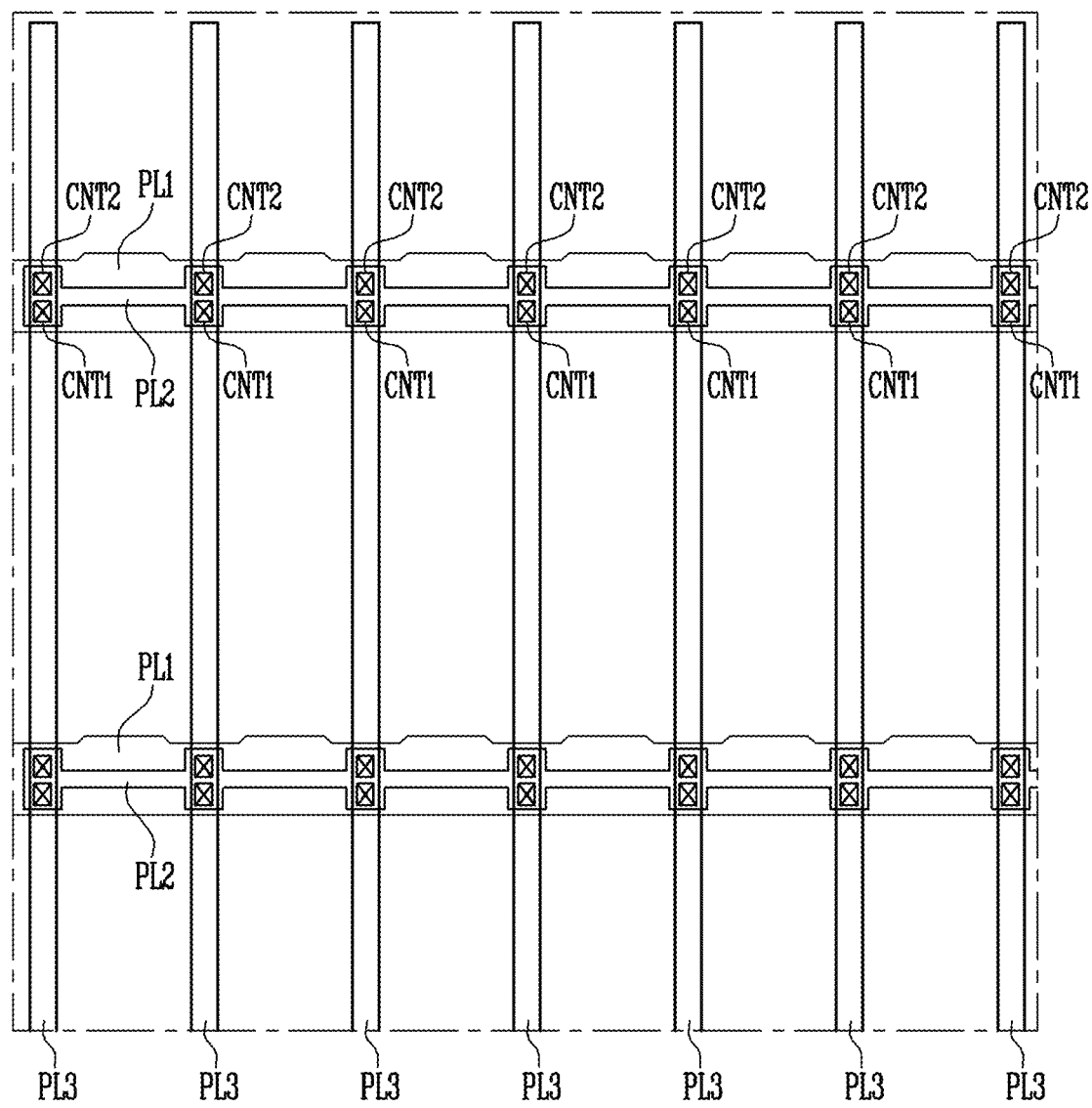
FIG. 18 is a plan view illustrating an example of the power line included in the display device of FIG. 1.

FIG. 17 is a plan view illustrating an example of the pixel of FIG. 2. FIG. 18 is a plan view illustrating an example of the power line included in the display device of FIG. 1.

In FIGS. 17 and 18, components identical to those described with reference to FIG. 3 are designated by like reference numerals, and their overlapping descriptions will be omitted. In addition, the pixel of FIG. 17 may have a configuration substantially identical or similar to that of the pixel of FIG. 3, except positions at which some of conductive patterns are disposed.

Referring to FIGS. 1, 17, and 18, the display device 1000 may include a substrate SUB, a plurality of conductive lines, and a pixel PX connected to the conductive lines.

The pixel PX may include a pixel circuit provided with first to seventh transistors T1 to T7 and a storage capacitor Cst, and an organic light emitting diode connected to the pixel circuit. The pixel circuit may be electrically connected to scan lines SLi and SLi−1, a data line DLj, a power line PL, and an initialization line VIL.

A jth data line DLj included in the pixel PX of FIG. 17 and the display device may be connected to pixels on an odd row, and a (j+1)th data line DLj+1 may be connected to pixels on an even row. Therefore, two data lines DLj and DLj+1 may overlap one pixel.

As shown in FIG. 18, the power line PL may include first to third power lines PL1, PL2, and PL3. The first power line PL1 and the second power line PL2 may extend in the horizontal direction, and the third power line PL3 may be extend in the vertical direction.

The first and second power lines PL1 and PL2 may be disposed in different layers, and be electrically connected to each other through the first and second contact holes CNT1 and CNT2. In an exemplary embodiment, the first and second power lines PL1 and PL2 may be electrically connected to each other through the first contact hole CNT1, and the second and third power lines PL2 and PL3 may be electrically connected to each other through the second contact hole CNT2, for example.

The first and second power lines PL1 and PL2 are disposed in a double wiring structure in the horizontal direction, so that a voltage drop (i.e., IR drop) of the first power voltage ELVDD may be decreased. Thus, the luminance uniformity of the display device 1000 may be improved.

As described above, the power line PL of the display device 1000 according to the exemplary embodiment of the invention has a double wiring structure in which at least portions of conductive patterns extend in one direction to overlap each other, so that the voltage drop (i.e., IR drop) of the first power voltage ELVDD may be decreased.

In addition, the first to third scan lines GI, GW, and GB may include a low-resistance metallic material such as aluminum alloy. Thus, the resistance of the scan lines GI, GW, and GB is decreased, so that the RC delay of a scan signal may be reduced. In addition, at least one of the scan line GI, GW, and GB is disposed in a conductive layer (i.e., a layer different from the gate electrode) including a low-resistance material (aluminum ally, etc.), and is connected to the gate electrode through contact holes. Thus, the resistance of the scan lines GI, GW, and GB is decreased, so that the RC delay of a scan signal may be minimized. Accordingly, the influence from peripheral interference and static electricity may be reduced.

Further, in the storage capacitor Cst according to the exemplary embodiment of the invention, an opening existing in the existing storage capacitor is removed, so that a capacitance variation caused by the formation of the opening is eliminated, and the capacitance (i.e., the area of an electrode) may be increased. Accordingly, a display spot and image crosstalk due to a capacitance variation of the storage capacitor Cst may be minimized.

Figure 19:
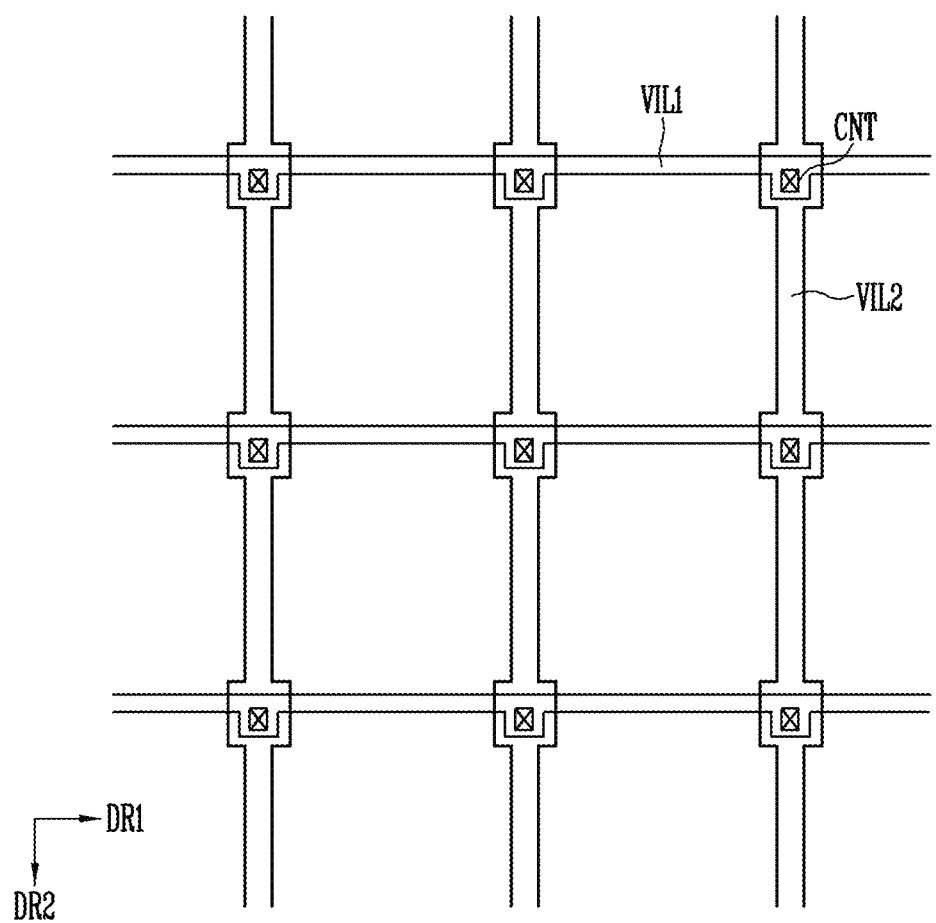
FIG. 19 is a plan view illustrating an example of the initialization lines included in the display device of FIG. 1.

FIG. 19 is a plan view illustrating an example of the initialization lines included in the display device of FIG. 1.

Referring to FIGS. 1, 4, 11, and 19, the initialization line VIL (refer to FIG. 2) may include a first initialization line (first initialization conductive pattern) VIL1 extending in the first direction DR1 and a second initialization line (second initialization conductive pattern) VIL2 extending in the second direction DR2.

According to the connection relationship of the first and second initialization lines VIL1 and VIL2, the initialization line VIL may be disposed in a mesh structure in the display region DA of FIG. 1.

In an exemplary embodiment, the first initialization line VIL1 may include the same material in the same layer as the active pattern. In an exemplary embodiment, the first initialization line VIL1 may include a semiconductor layer doped with an impurity, for example.

The second initialization line VIL2 may be disposed on the third insulating interlayer IL3. The second initialization line VIL2 may include the same material in the same layer as the third conductive pattern PL3.

In an exemplary embodiment, the second initialization line VIL2 may be connected to the first initialization line VIL1 through a contact hole CNT penetrating the first to third insulating interlayers ILL IL2, and IL3 and the gate insulating layer GIL.

However, this is merely illustrative, and the first initialization line VIL1 is not limited thereto. In an exemplary embodiment, the first initialization line VIL1 may be further disposed in the same layer the second conductive pattern PL2 disposed on the second insulating interlayer IL2, for example. The first initialization line disposed on the second insulating interlayer IL2 may be connected to the first initialization line VIL1 and/or the second initialization line VIL2, disposed in the same layer as the active pattern, through a predetermined contact hole.

The invention may be applied to display devices and electronic devices including the same. In an exemplary embodiment, the organic light emitting display device may be applied to not only electronic devices such as computers, mobile phones, smart phones, and smart pad, but also vehicle navigation systems, head-up displays, etc., for example. Also, the organic light emitting display device may be applied to wearable display devices wearable on bodies of users.

In the display device according to the invention, the resistance of the power lines and the scan lines are decreased, so that the RC delay of a scan signal and a voltage drop through the power line may be minimized. Further, the improved capacitance of the storage capacitor may be uniformly ensured. Thus, the luminance uniformity and image quality of the display device may be improved.

Exemplary embodiments have been disclosed herein, and although specific terms are employed, they are used and are to be interpreted in a generic and descriptive sense only and not for purpose of limitation. In some instances, as would be apparent to one of ordinary skill in the art as of the filing of the application, features, characteristics, and/or elements described in connection with a particular embodiment may be used singly or in combination with features, characteristics, and/or elements described in connection with other exemplary embodiments unless otherwise specifically indicated. Accordingly, it will be understood by those of skill in the art that various changes in form and details may be made without departing from the spirit and scope of the invention as set forth in the following claims.

What is claimed is:
1. A display device comprising:
a substrate including a display region and a non-display region;
a plurality of pixels in the display region, the plurality of pixels each including at least one transistor, a storage capacitor connected to the at least one transistor, and a light emitting element connected to the at least one transistor;
a plurality of scan lines connected to each of the plurality of pixels, the plurality of scan lines extending in a first direction;
a data line connected to each of the plurality of pixels, the data line extending in a second direction crossing the first direction; and
a power line supplying a first power voltage to the light emitting element, wherein the at least one transistor includes:
an active pattern provided on the substrate;
source and drain electrodes each connected to the active pattern;
a gate electrode provided on the active pattern with a gate insulating layer interposed therebetween to overlap the active pattern;
an insulating interlayer covering the gate electrode and including a first insulating interlayer;
a second insulating interlayer, and a third insulating interlayer, which are sequentially stacked; and
a protective layer provided on the insulating interlayer, and wherein the power line includes:
a first conductive pattern mainly extending in the first direction, the first conductive pattern being provided on the first insulating interlayer;
a second conductive pattern mainly extending in the first direction, the second conductive pattern being provided on the second insulating interlayer, the second conductive pattern being connected to the first conductive pattern through a first contact hole; and
a third conductive pattern mainly extending in the second direction, the third conductive pattern being provided on the third insulating interlayer, the third conductive pattern being connected to the second conductive pattern through a second contact hole.

2. The display device of claim 1, wherein the storage capacitor includes:
a lower electrode disposed in a same layer as the gate electrode; and
an upper electrode overlapping the lower electrode, the upper electrode being disposed on the first insulating interlayer.

3. The display device of claim 2, wherein the first conductive pattern and the second conductive pattern overlap at least a portion of the lower electrode of the storage capacitor.

4. The display device of claim 2, wherein an area of the first conductive pattern overlapping the lower electrode is larger than an area of the second conductive pattern overlapping the lower electrode.

5. The display device of claim 2, wherein, in a plan view, an opening is not defined in the upper electrode.

6. The display device of claim 1, wherein the power line has a mesh structure by connection of the first to third conductive patterns.

7. The display device of claim 1, wherein scan lines of the plurality of scan lines are disposed in a same layer as the second conductive pattern, and are connected to the gate electrode.

8. The display device of claim 7, wherein remaining scan lines of the plurality of scan lines are disposed in a same layer as the gate electrode.

9. The display device of claim 7, wherein the gate electrode is a conductive pattern having an island shape.

10. The display device of claim 7, wherein at least one of the scan lines includes aluminum alloy.

11. The display device of claim 7, further comprising:
an emission control line connected to each of the plurality of pixels, the emission control line extending in the first direction.

12. The display device of claim 11, wherein the emission control line is disposed in a same layer as the gate electrode.

13. The display device of claim 11, wherein the emission control line is disposed in a same layer as the second conductive pattern.

14. The display device of claim 1, further comprising:
an initialization line supplying an initialization voltage to the plurality of pixels,
wherein the initialization line includes a first initialization conductive pattern disposed in a same layer as the second conductive pattern, the first initialization conductive pattern extending in the first direction.

15. The display device of claim 14, wherein the initialization line further includes:
a second initialization conductive pattern disposed in a same layer as the third conductive pattern, the second initialization conductive pattern extending in the second direction.

16. The display device of claim 14, further comprising:
a shielding pattern disposed in a same layer as the first conductive pattern, the shielding pattern being connected to the first initialization conductive pattern.

17. The display device of claim 16, wherein the at least one transistor includes a driving transistor controlling a driving current flowing through the light emitting element,
wherein, in a plan view, the shielding pattern includes a portion located between the data line and a gate node of the driving transistor.

18. The display device of claim 1, further comprising:
an initialization line supplying an initialization voltage to the plurality of pixels,
wherein the initialization line includes:
a first initialization conductive pattern disposed in a same layer as the active pattern, the first initialization conductive pattern extending in the first direction; and
a second initialization conductive pattern disposed in a same layer as the third conductive pattern, the second initialization conductive pattern extending in the second direction.

19. A display device comprising:
a substrate including a display region and a non-display region;
a plurality of pixels in the display region, the plurality of pixels each including at least one transistor, a storage capacitor connected to the at least one transistor, and a light emitting element connected to the at least one transistor;
a plurality of scan lines connected to each of the plurality of pixels, the plurality of scan lines extending in a first direction;
a data line connected to each of the plurality of pixels, the data line extending in a second direction crossing the first direction; and
a power line supplying a first power voltage to the light emitting element,
wherein the at least one transistor includes:
an active pattern provided on the substrate, source and drain electrodes each connected to the active pattern;
a gate electrode provided on the active pattern with a gate insulating layer interposed therebetween to overlap the active pattern;
an insulating interlayer covering the gate electrode and including:
a first insulating interlayer, a second insulating interlayer, and a third insulating interlayer, which are sequentially stacked; and
a protective layer provided on the third insulating interlayer, and
wherein at least one of the plurality of scan lines is disposed between the second insulating interlayer and the third insulating interlayer, and is connected to the gate electrode through a contact hole, wherein the second insulating interlayer includes an inorganic insulating layer, wherein the third insulating interlayer includes an organic insulating layer, the third insulating interlayer covering the plurality of scan lines and the power line, and wherein the third insulating interlayer contacts at least one of the plurality of scan lines, wherein the power line includes:

a first conductive pattern extending in the first direction, the first conductive pattern being provided on the first insulating layer;

a second conductive pattern extending in the first direction, the second conductive pattern being provided on the second insulating interlayer, the second conductive pattern being connected to the first conductive pattern; and a third conductive pattern extending in the second direction, the third conductive pattern being provided on the third insulating interlayer, the third conductive pattern being connected to the second conductive pattern, and wherein resistances of the second conductive pattern and the third conductive pattern are smaller than a resistance of the first conductive pattern.

20. The display device of claim 19, wherein the gate electrode connected to the at least one of the plurality of scan lines is a conductive pattern having an island shape.

21. The display device of claim 19, wherein an area of the first conductive pattern is larger than that of the second conductive pattern.

22. The display device of claim 19, further comprising:

an emission control line connected to each of the plurality of pixels, the emission control line extending in the first direction.

23. The display device of claim 19, wherein the emission control line is disposed in a same layer as the gate electrode.

24. The display device of claim 19, wherein the storage capacitor includes:

a lower electrode disposed in a same layer as the gate electrode; and an upper electrode overlapping the lower electrode, the upper electrode being disposed on the first insulating interlayer, wherein, in a plan view, an opening is not defined in the upper electrode.

25. The display device of claim 19, further comprising:

an initialization line supplying an initialization voltage to the plurality of pixels, wherein the initialization line includes:

a first initialization conductive pattern disposed on the second insulating interlayer, the first initialization conductive pattern extending in the first direction; and a second initialization conductive pattern disposed on the third insulating interlayer, the second initialization conductive pattern extending in the second direction.

* * * * *